(12) United States Patent
Juengling

(10) Patent No.: US 8,482,046 B2
(45) Date of Patent: Jul. 9, 2013

(54) CONCENTRIC OR NESTED CONTAINER CAPACITOR STRUCTURE FOR INTEGRATED CIRCUITS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/215,529

(22) Filed: Aug. 23, 2011

(65) Prior Publication Data
US 2011/0303957 A1    Dec. 15, 2011

Related U.S. Application Data

(60) Division of application No. 12/875,303, filed on Sep. 3, 2010, now Pat. No. 8,017,985, which is a continuation of application No. 11/449,539, filed on Jun. 7, 2006, now Pat. No. 7,807,541, which is a division of application No. 10/873,008, filed on Jun. 22, 2004, now abandoned.

(51) Int. Cl.
*H01L 31/062* (2012.01)

(52) U.S. Cl.
USPC ............... 257/300; 257/301; 257/E29.218; 257/E29.346

(58) Field of Classification Search
USPC ............. 257/300, 301, 303, 306, E29.218, 257/E29.346
See application file for complete search history.

(56) References Cited

U.S. PATENT DOCUMENTS

| | | | |
|---|---|---|---|
| 5,053,839 A | 10/1991 | Esquivel et al. | |
| 5,801,079 A | 9/1998 | Takaishi | |
| 5,891,768 A | 4/1999 | Figura et al. | |
| 5,950,084 A * | 9/1999 | Chao | 438/244 |
| 6,188,121 B1 | 2/2001 | Baldi et al. | |
| 6,261,895 B1 * | 7/2001 | Adkisson et al. | 438/240 |
| 6,319,787 B1 | 11/2001 | Enders et al. | |
| 6,445,028 B1 * | 9/2002 | Yoshida et al. | 257/306 |
| 6,498,386 B2 | 12/2002 | Pan | |
| 6,710,391 B2 | 3/2004 | Houston | |
| 6,790,725 B2 | 9/2004 | Coursey | |
| 6,800,523 B2 | 10/2004 | Houston | |
| 6,972,451 B2 | 12/2005 | Delpech et al. | |
| 7,199,003 B2 | 4/2007 | Yeong et al. | |
| 7,312,131 B2 | 12/2007 | Wu | |

* cited by examiner

*Primary Examiner* — Julia Slutsker
(74) *Attorney, Agent, or Firm* — Schwegman, Lundberg & Woessner, P.A.

(57) ABSTRACT

Disclosed are embodiments for a container capacitor structure in which at least two container capacitors, e.g., an inner and outer container capacitor, are made concentric and nested with respect to one another. The nested capacitors are formed in one embodiment by defining a hole in a dielectric layer for the nested container capacitors in the vicinity of two capacitor contact plugs. An outer capacitor plate is formed by etching back poly 1 to leave it substantially on the vertical edges of the hole and in contact with one of the plugs. At least one sacrificial sidewall is formed on the poly 1, and poly 2 is deposited over the sidewalls to form an inner capacitor plate in contact with the other plug. The structure is planarized, the sacrificial sidewalls are removed, a capacitor dielectric is formed, and is topped with poly 3. Additional structures such as a protective layer (to prevent poly 1-to-poly 2 shorting) and a conductive layer (to strap the plugs to their respective poly layers) can also be used.

20 Claims, 27 Drawing Sheets

CONCENTRIC OR NESTED CONTAINER CAPACITOR STRUCTURE FOR INTEGRATED CIRCUITS

CROSS REFERENCE TO RELATED APPLICATIONS

This application is a divisional of U.S. patent application Ser. No. 12/875,303, filed Sep. 3, 2010, which is a continuation of U.S. patent application Ser. No. 11/449,539, filed Jun. 7, 2007 (now U.S. Pat. No. 7,807,541), which was a divisional of U.S. patent application Ser. No. 10/873,008, filed Jun. 22, 2004 (now abandoned). Priority is claimed to these applications, and they are incorporated herein by reference in their entireties.

FIELD OF THE INVENTION

This invention relates to the structure and fabrication of concentric or nested capacitors for integrated circuits, and specifically in one embodiment to the use of such capacitors in dynamic random access memory (DRAM) cells.

BACKGROUND

Container capacitors are well known in the art of semiconductor processing, and are particularly well known as a capacitor structure used in dynamic random access memories (DRAMs). A basic DRAM cell is schematically shown in FIG. 1A, and a cross section of a few of such cells is shown in FIG. 1B. The cross section of FIG. 1B shows only the basic features of a DRAM cell and for simplicity omits many details and processes steps which are well known in the art. As is known, two adjacent cells share a common bit line (BL) 12 which as shown constitutes a doped region of the silicon substrate 10. Each cell contains a word line (WL) 14 which constitutes the access transistor for the cell by coupling the bit line 12 to another doped region 16 of the silicon. This doped region 16 is connected to a container capacitor 18 via a polysilicon plug 17. The capacitor 18 is typically comprised of two layers 19, 20 of polysilicon, one of which (20) forms a "plate" with a voltage (Vplate) common to all of the capacitors 18. The layers 19, 20 are separated by a dielectric 21.

The container capacitors 18 are generally formed by etching a hole in the dielectric 22 (typically, a silicon dioxide or "oxide") that overcoats the word lines 14 to expose plugs 17. This hole may extend over the word lines 14, but this is not shown for simplicity. A first layer of polysilicon (or "poly") 19 is deposited within the hole and planarized or patterned to form a "U" shape in cross section, and which in three dimensions would resemble a "cup" or a "box" with an open top. The capacitor dielectric 21 (e.g., oxide, silicon nitride ("nitride"), silicon oxynitride ("oxynitride"), or any combination of these) is formed, and the second layer of poly 20 is deposited. After these processing steps, the original hole in the dielectric 22 may be completely filled by the poly 20, or may subsequently be intentionally filled by another dielectric layer (not shown).

A container capacitor 18 helps to increase the density of the cells in a DRAM because the capacitors are three-dimensional rather than planar, hence allowing a larger area capacitor in a smaller two-dimensional "footprint" on the silicon 10. However, as fabrication technologies advance, and as structures are made of smaller dimensions and at higher densities, the capacitors 18 can be affected. Smaller capacitor sizes equate to lower capacitances, and hence lower amounts of charge the capacitor can store. Accordingly, and again as a general matter, the sizes of the capacitors in DRAM cell are formed relatively large when compared to other structures of the cell to achieve a suitable capacitance. (Of course, other parameters such as dielectric thickness and dielectric constant also affect capacitance). But relatively large capacitors are disadvantageous to the density and/or area of the overall cell. Attempts to make suitably capacitive container capacitors larger by making them narrower but deeper can be difficult to pattern and etch, and require lithography alignments that can be difficult to achieve. As such, container capacitors can constitute a limiting factor in DRAM cell design. Thus, the art would be benefited by an improved design for such container capacitors, and specifically would be benefited by container capacitor structures that provide suitable capacitances, are easy to fabricate, do not require leading-edge line width processing and alignment, and which take up a limited two-dimensional footprint relative to the silicon substrate. This disclosure presents solutions.

SUMMARY

Disclosed are embodiments for a container capacitor structure in which at least two container capacitors, e.g., an inner and outer container capacitor, are made concentric and nested with respect to one another. The nested container capacitor structure can in one embodiment be used as the capacitors for two DRAM cells, which takes up less space than would individually-formed container capacitors and are easier to fabricate. The nested capacitors are formed in one embodiment by defining a hole in a dielectric layer for the nested container capacitors in the vicinity of two capacitor contact plugs. An outer capacitor plate is formed by etching back polysilicon (poly 1) to leave it substantially on the vertical edges of the hole and in contact with one of the plugs. At least one sacrificial sidewall is then formed on the poly 1, and a second layer of polysilicon (poly 2) is deposited over the sidewall to form an inner capacitor plate in contact with the other plug. The structure is planarized and the sacrificial sidewalls are removed. A capacitor dielectric is formed, and is topped with a cell plate polysilicon layer (poly 3). Additional structures such as a protective layer (to prevent poly 1-to-poly 2 shorting) and a conductive layer (to strap the plugs to their respective poly layers) can also be used, which provide design flexibility and add process margin.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

Figure 1A:
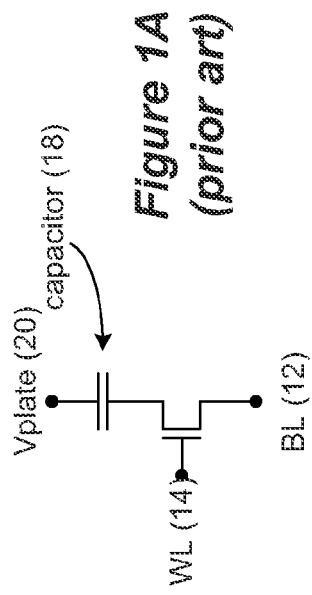
FIGS. 1A and 1B illustrate a schematic of a prior art DRAM cell and a cross sectional view showing container capacitors structures for the cells.
Figure 1B:
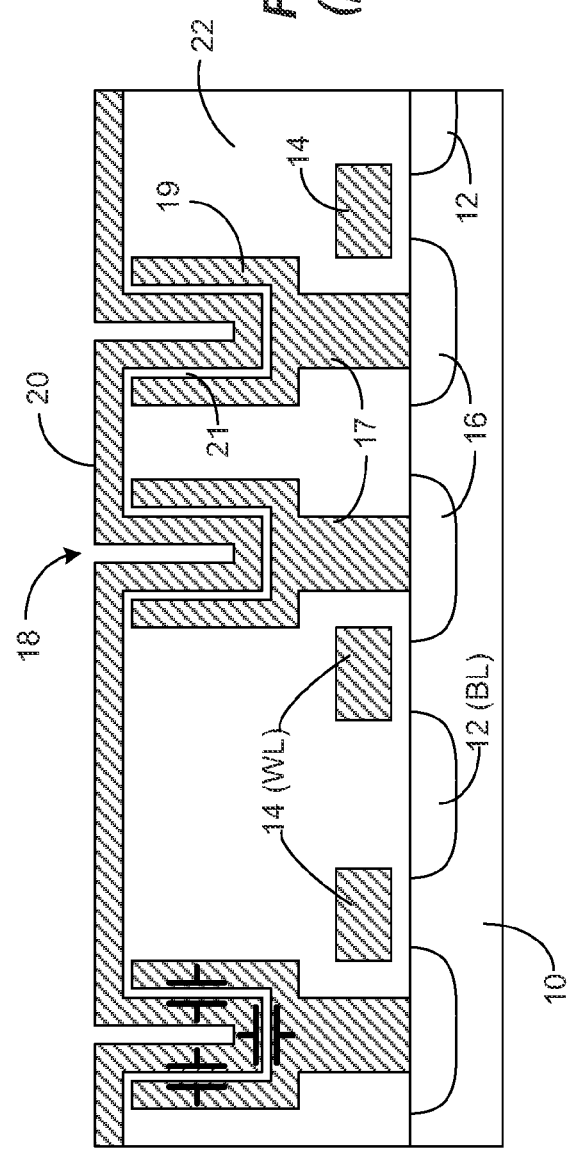
Figure 2:
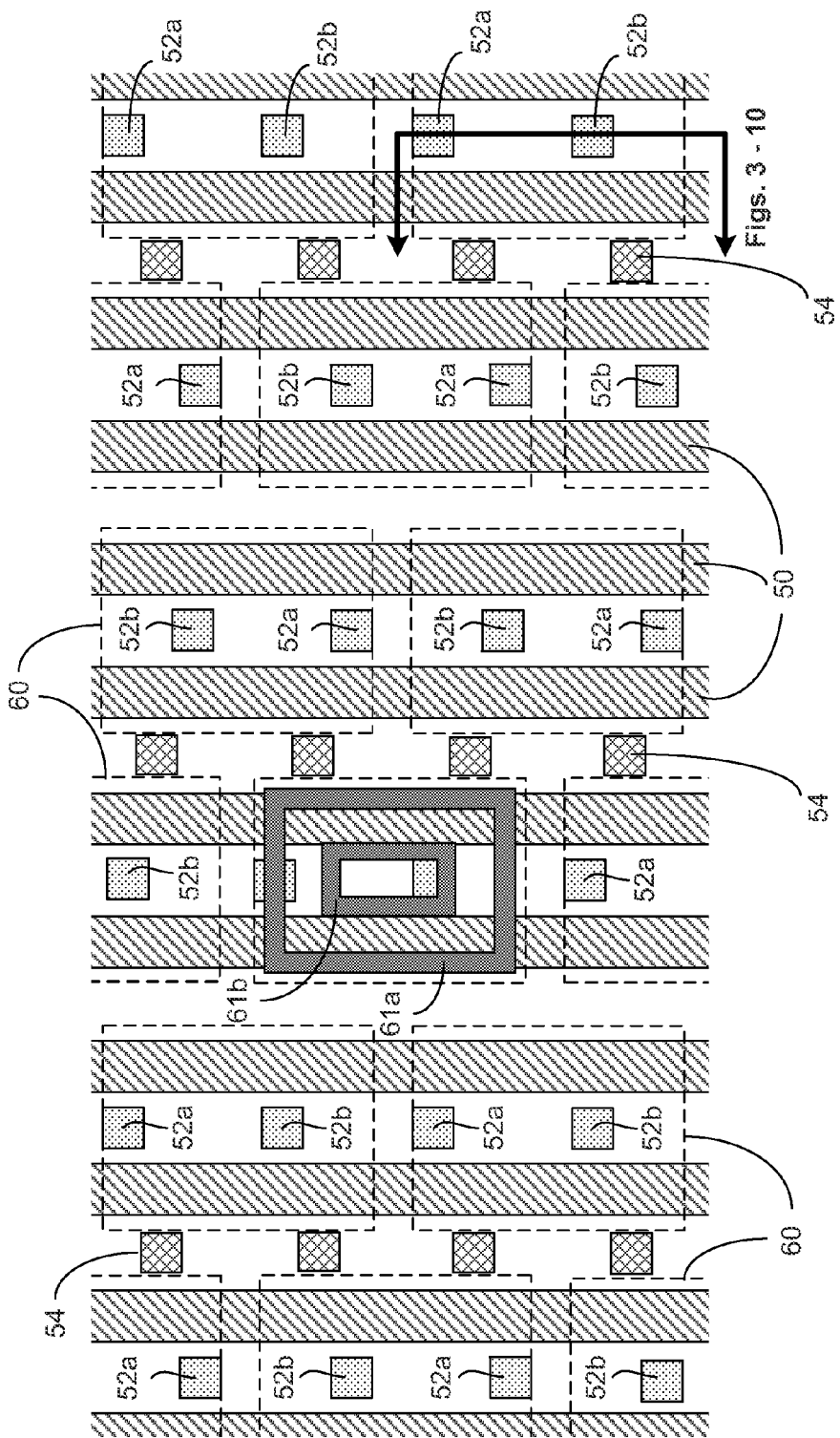
FIG. 2 illustrates a top down view of the layout of certain structures in a DRAM array employing an embodiment of the disclosed nested container capacitor structure, including the nested container capacitor area.

FIG. 2 illustrates a top-down view of certain structures in a DRAM array fabricated employing the concentric or nested container capacitors whose structure will be introduced shortly. Specifically shown are bit line contacts 54, which may constitute tungsten plugs contacting overlying metallic bit lines which would run from right to left, but which are not shown for convenience. Word lines 50 run from top to bottom, and are typically formed from silicided polysilicon. Polysilicon plugs 52a, 52b, akin to plug 17 of FIG. 1, are also shown and which eventually will make contact to the bottom plates of the container capacitors. Thus, it is noticed that a word line 50 intervenes between given pairs of bit line contacts 54 and one of the polysilicon plugs 52a, 52b to form the access transistors for the cells. (The doped regions of the silicon substrate to which the contacts 54 and plugs 52a, 52b make contact, as well as isolation between each of theses regions, are not shown for clarity).

Also shown in FIG. 2 are container capacitor areas 60, which loosely define the footprint of the container capacitors which ultimately will overlie the shown structures. In an exemplary embodiment, each of the container capacitor areas 60 are formed over two polysilicon plugs: plug 52a formed near the periphery of each of the areas 60 and plugs 52b formed roughly near the center of the areas 60. Accordingly, each of the areas 60 will ultimately contain two container capacitors—an inner and an outer capacitor—each in contact with one of the plugs 52a or 52b, and thus ultimately in communication with one access transistor and one cell. As will be seen, the two container capacitors in each area 60 are preferably nested or concentric. An exemplary outline the vertical extent of the bottom plates for each of these nested container capacitors are shown as elements 61a (the bottom plate of the outer capacitor, corresponding to plugs 52a) and 61b (the bottom plate of the inner capacitor, corresponding to plugs 52b).

FIGS. 3-10 illustrate a preferred embodiment of the nested container capacitor structure, and how such structure is formed. The processing steps described as well as the materials used are merely exemplary. The illustrated thicknesses and dimensions for the fabricated structures are not drawn to scale to better illustrate aspects of the invention.

Figure 3:
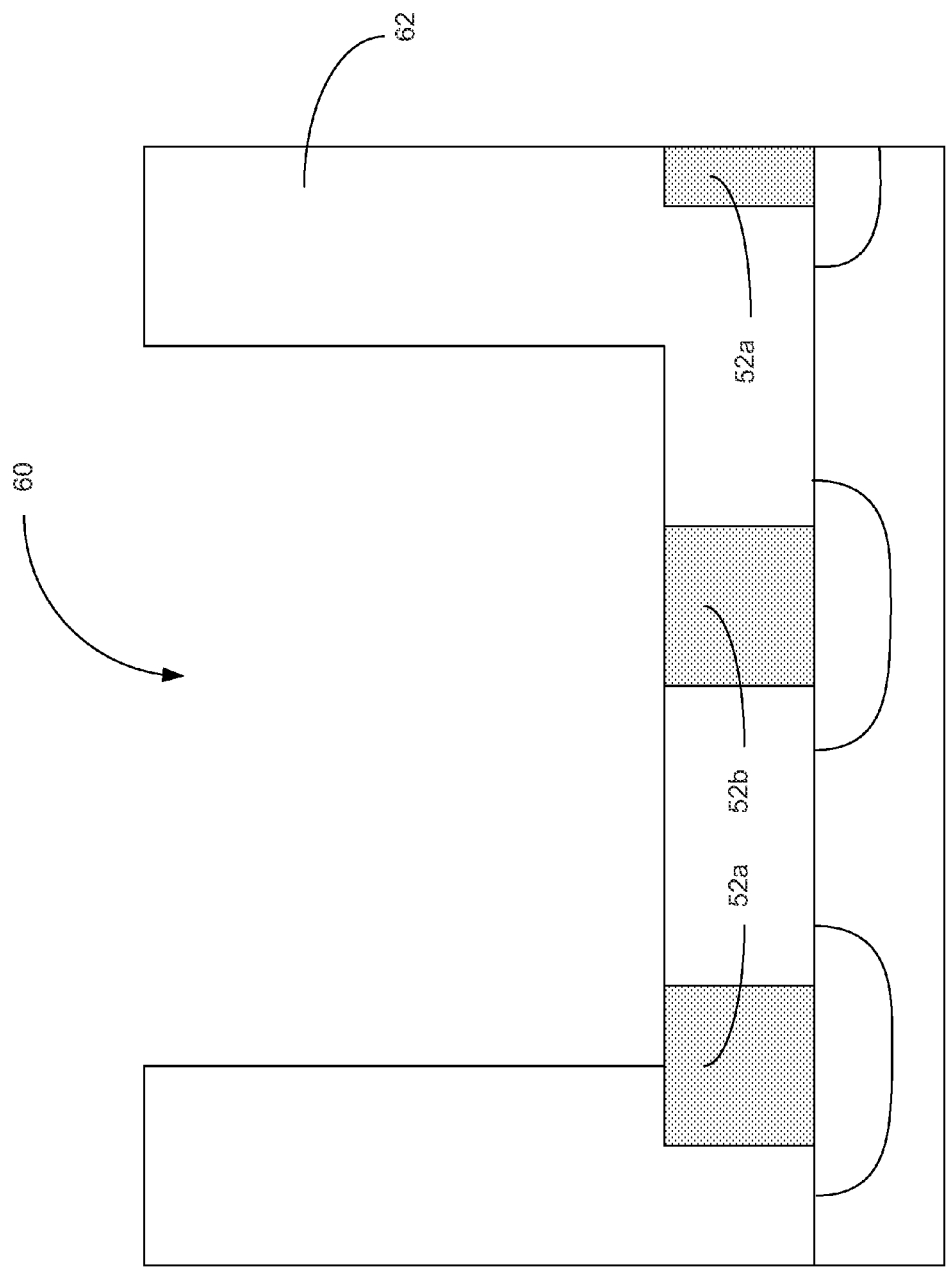
FIGS. 3-10 illustrate the process steps for making an embodiment of the disclosed nested contain capacitor structure.

Starting with FIG. 3, the poly plugs 52a, 52b are formed and the structure is planarized. (Earlier fabricated structures, such as the word lines, are not shown). Then a dielectric layer 62, preferably a densified oxide, is deposited and is planarized if necessary. As one skilled in the art will appreciate, the dielectric layer 62 at this point in the process may actually comprise a number a different dielectric layers or sub-layers, but such layers or sub-layers are not shown for convenience.

A hole 60 (roughly corresponding to the container capacitor areas 60 of FIG. 2) is etched in the dielectric layer 62 to expose at least a portion of the surfaces of the plugs 52a, 52b. As will be appreciated from subsequent processing steps, alignment of this hole 60, while important, need not adhere to the strictest of manufacturing tolerances, as some amount of misalignment is tolerable. The most critical issue for this embodiment is that at least some of the top surface of both plugs 52a, 52b be suitably exposed by each hole 60, even if these surfaces are not exposed in their entireties. Additionally, the hole 60 in this embodiment should not expose any portion of the plugs in adjacent cell areas. Otherwise, the hole 60 is relatively large, easily patterned, and easily anisotropically plasma etched; by comparison, non-nested container capacitor approaches of the prior art will involve smaller holes whose fabrication and alignment is more critical and difficult to achieve. One skilled in the art will appreciate that while the holes 60 have been shown as being roughly rectangular in shape (see FIG. 2), in an actual processing environment the corners of the holes 60 may be rounded by nature of the lithography and the chemical processing that forms them. The holes 60 could also be essentially round in shape. The hole 60 might be approximately 0.1 to 0.3 microns wide, and 2.0 microns deep. Plasma etchant processes for anisotropically etching oxides with good selectivity to other materials are well known.

Figure 4:
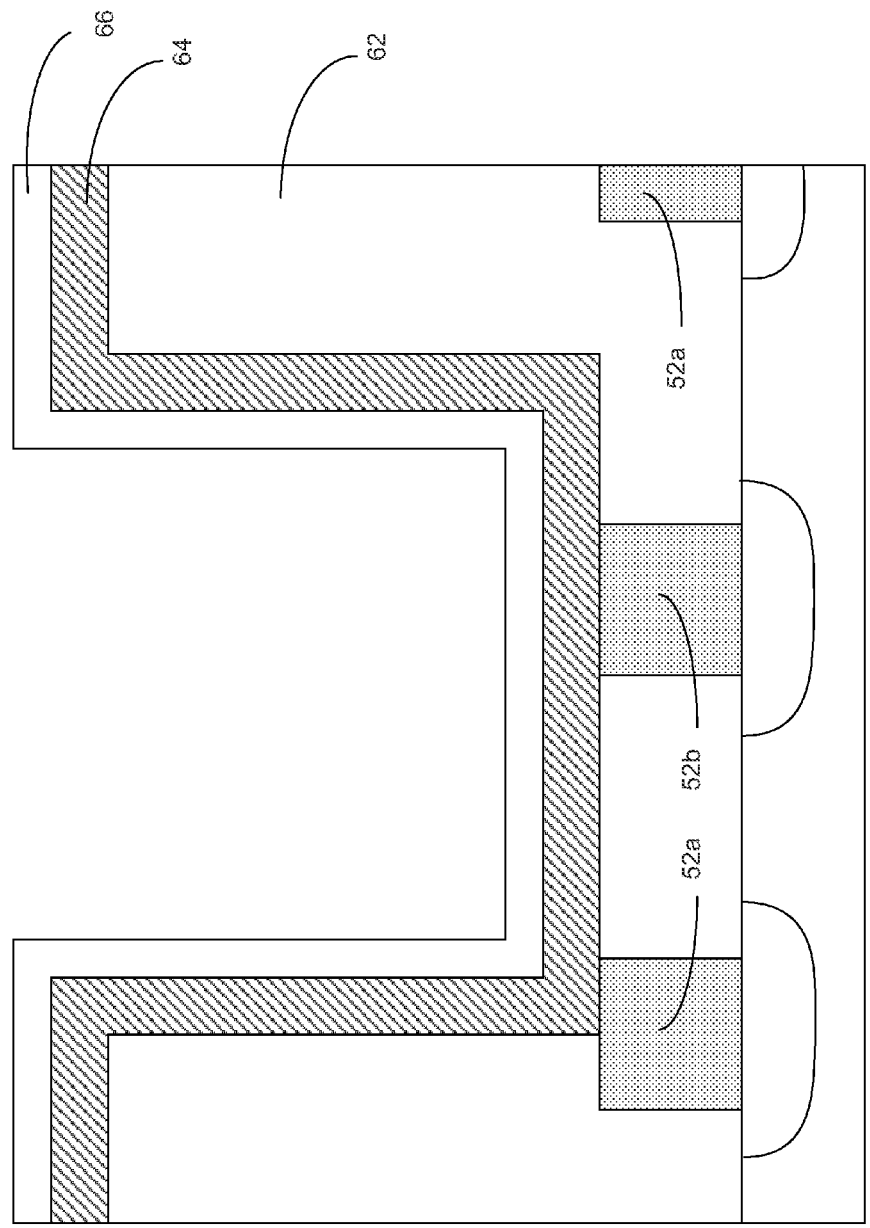

After etching the hole 60 and routine cleansing of the exposed surfaces of the plugs 52a, 52b, a first layer of polysilicon ("poly 1") 64 is deposited, which is preferably followed by the deposition of a titanium nitride (TiN) layer 66, rendering the structure shown in FIG. 4. (Although called "poly 1" for convenience, one skilled in the art will recognize that other polysilicon layers are likely used earlier in the process, such as those that are used to form the word lines and the plugs 52a, 52b). The poly 1 64 preferably ranges from approximately 100 to 500 Angstroms in thickness, and the TiN 66 preferably ranges from approximately 100 to 500 Angstroms in thickness.

Figure 5:
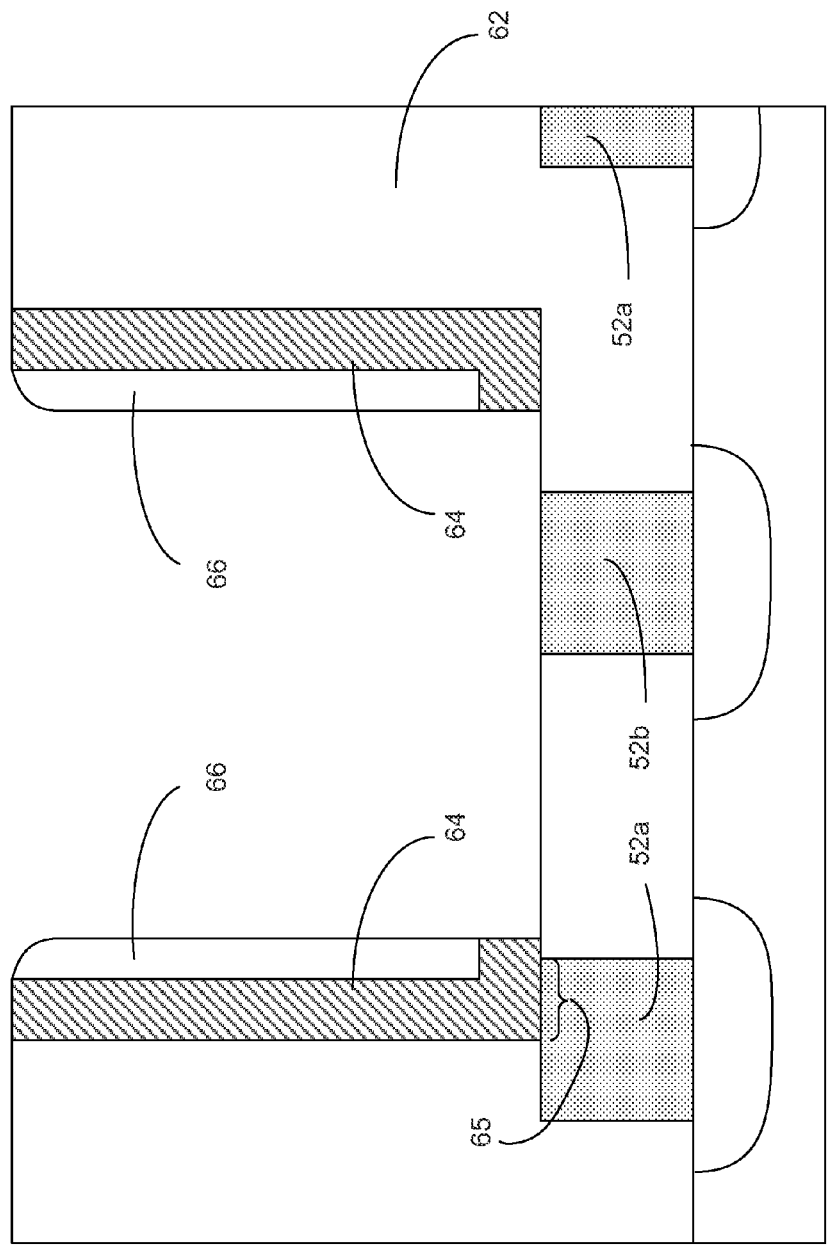

Thereafter, and as shown in FIG. 5, the resulting structure is anisotropically etched back to leave poly 1 64 and TiN 66 on the vertical surfaces of the hole 60. As is known, such anisotropic etch back processing will leave the remaining poly 64/TiN 66 as a sidewall or spacer around the hole 60 as shown. In this regard, it should be remembered that the holes 60 are roughly rectangular, and hence the remaining sidewall appears along all four vertical surfaces of the hole 60. In this embodiment, it is preferable to use a plasma etchant that will etch both polysilicon and TiN, such as $CHF_3$, $CF_4$, etc.

Note that a portion 65 of the poly 1 64 remains in contact with plug 52a. As will be seen, poly 1 64 will constitute the bottom plate of the outer container capacitor (i.e., for those cells in communication with plugs 52a).

Figure 6:
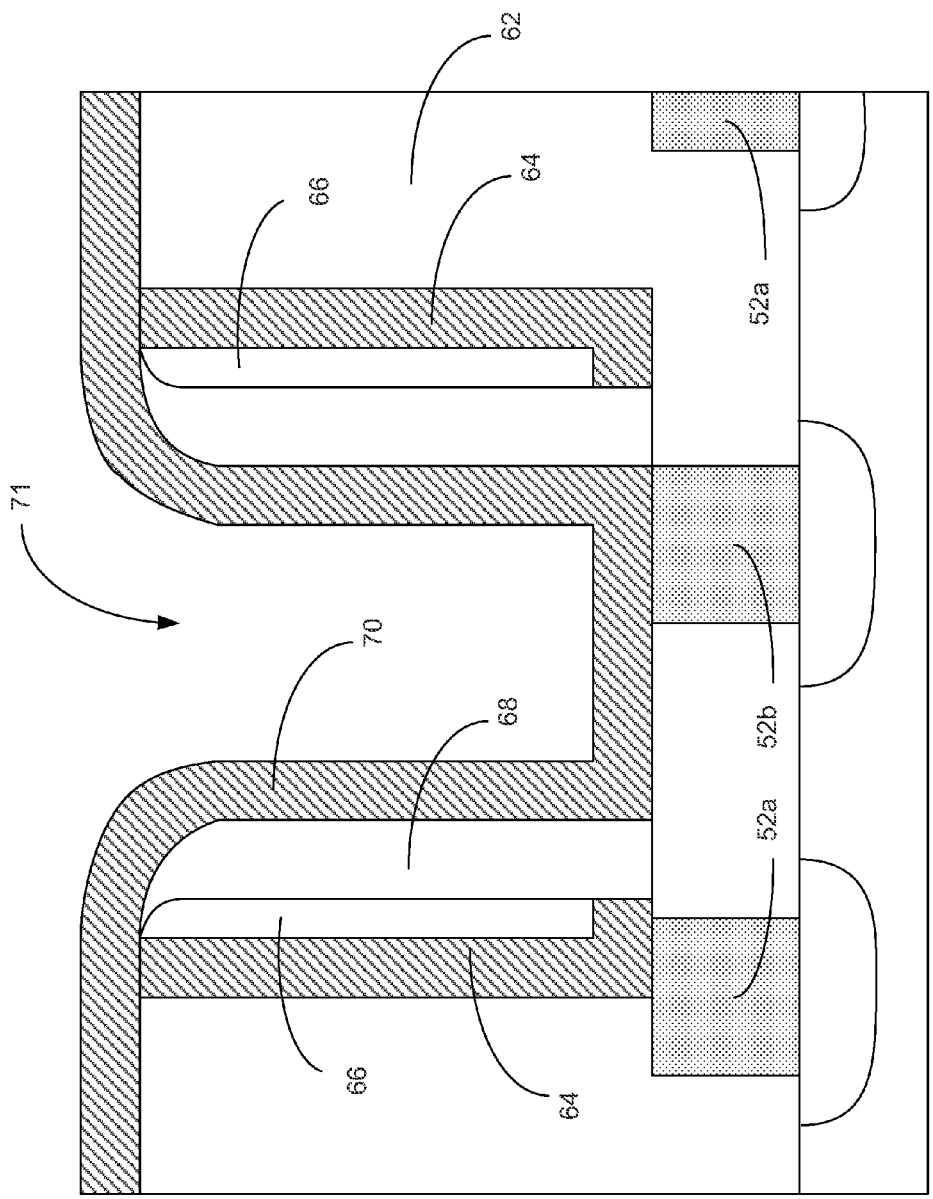

Next, and referring to FIG. 6, another dielectric 68 is formed conformally on the resulting structure (not shown) and is anisotropically etched back to form dielectric sidewalls 68. Dielectric 68 preferably ranges from approximately 50 to 200 Angstroms in thickness. This dielectric 68 is preferably TiN or an undensified silicon oxide ("oxide") which is relative easy to etch compared to other dielectrics (e.g., dielectric 62) present in the device for reasons that will be made clear shortly. Thereafter, a second layer of polysilicon ("poly 2") 70 is deposited on the resulting structure, which preferably ranges from approximately 100 to 500 Angstroms in thickness.

Figure 7:
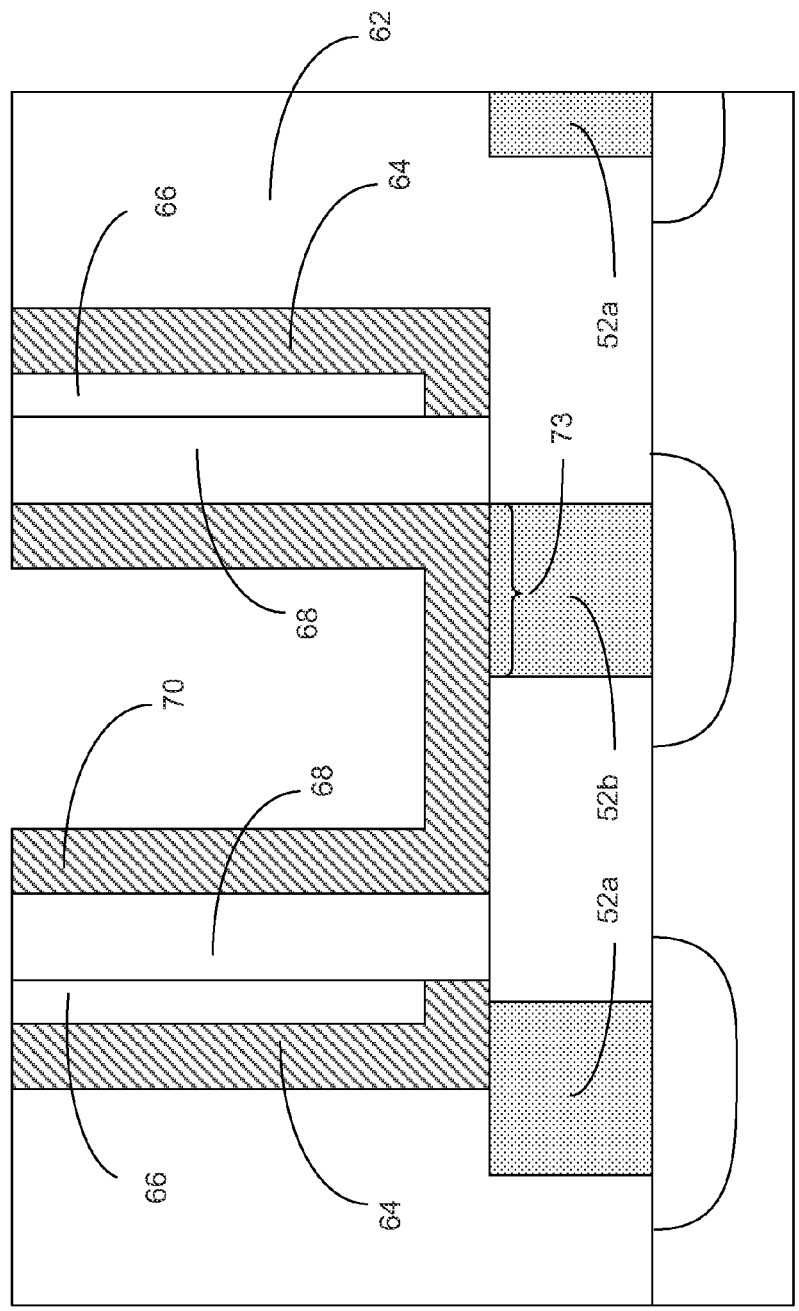

Next, the top of the resulting structure is planarized, preferably using Chemical-Mechanical Polishing (CMP), resulting in the structure of FIG. 7. During the CMP procedure, it may be beneficial to fill the hole 71 defined by the poly 2 70 with some sort of sacrificial layer (not shown) to provide mechanical rigidity and to provide a solid surface which will planarized evenly. In this regard, hole 71 can first be filled with photoresist, which is later dissolved away after planarization. However, other sacrificial layers can be used, and preferably would not affect underlying structures when they were deposited or removed. The CMP procedure may remove approximately 2000 Angstroms of material, and in any event preferably removes the rounded edges at the top of the TiN 66, the dielectric 68, and the poly 2 70.

Note that a portion 73 of the poly 2 70 remains in contact with plug 52b. As will be seen, poly 2 70 will constitute the bottom plate of the inner container capacitor (i.e., for those cells in communication with plugs 52b).

Figure 8:
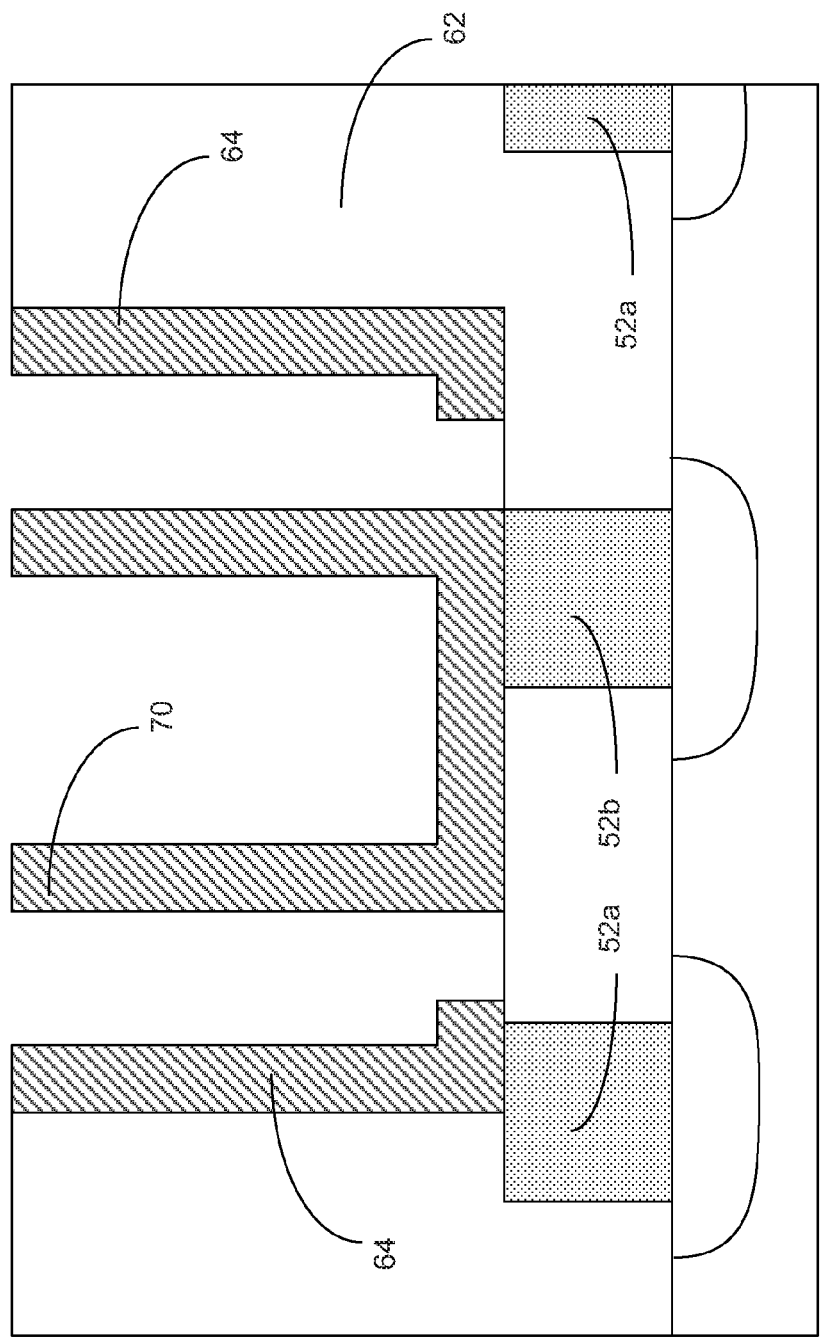

The structure of FIG. 7 is then subjected to processing to remove those portions of the TiN 66 and dielectric 68 still remaining, resulting in the structure shown in FIG. 8. Such processing preferably constitutes wet etching. Specifically, TiN 66 can be removed using a well-known "piranha" etch solution, which has good selectivity to and hence will not etch other materials present on the substrate. Dielectric 68 can then be removed with a hydrofluoric (HF) acid solution which has similarly good selectivity. The HF solution may slightly attack the dielectric 62, which like dielectric 68 is preferably an oxide, but because that oxide 62 is preferable a dense oxide compared to the oxide 68, oxide 68 will etch preferentially much more quickly.

Figure 9:
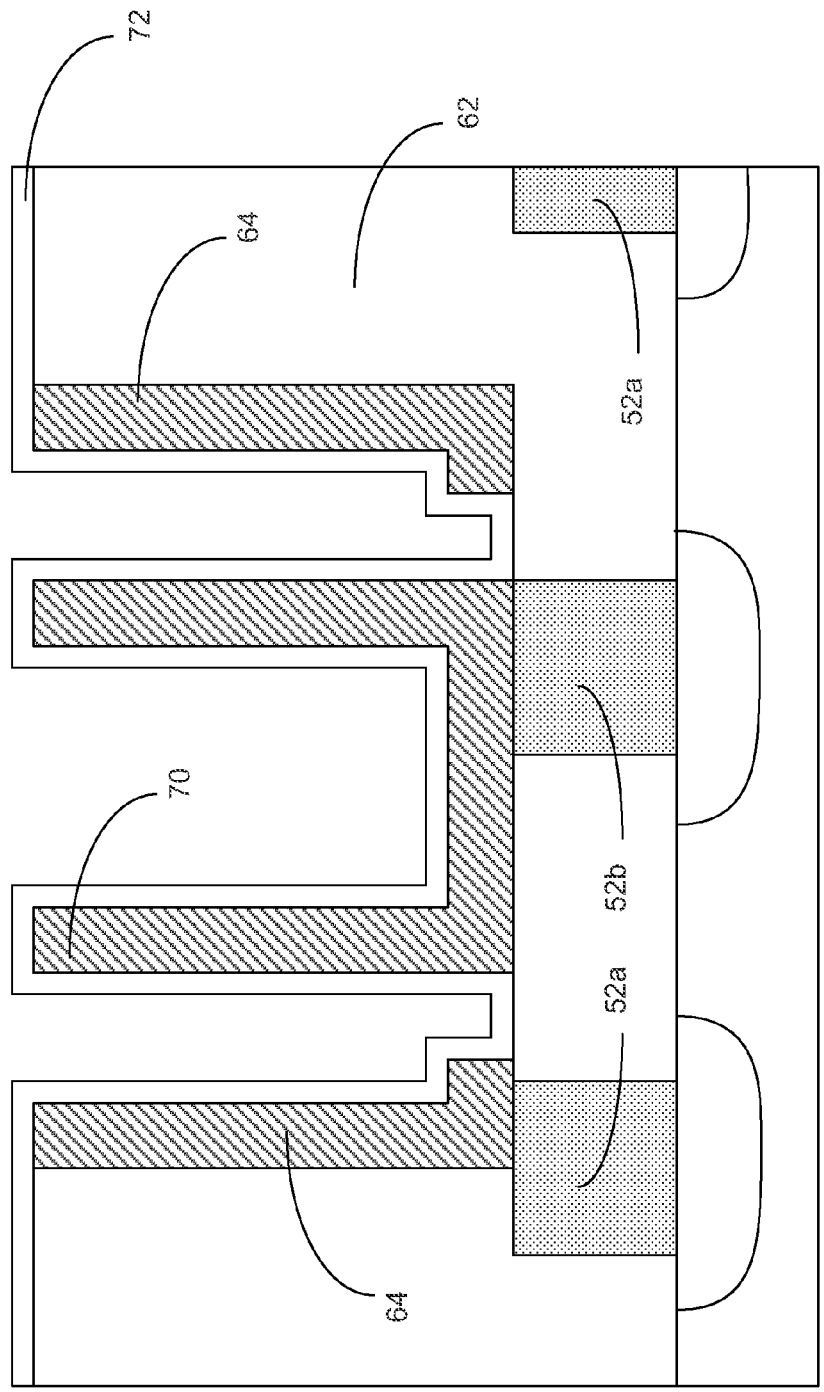
Figure 10:
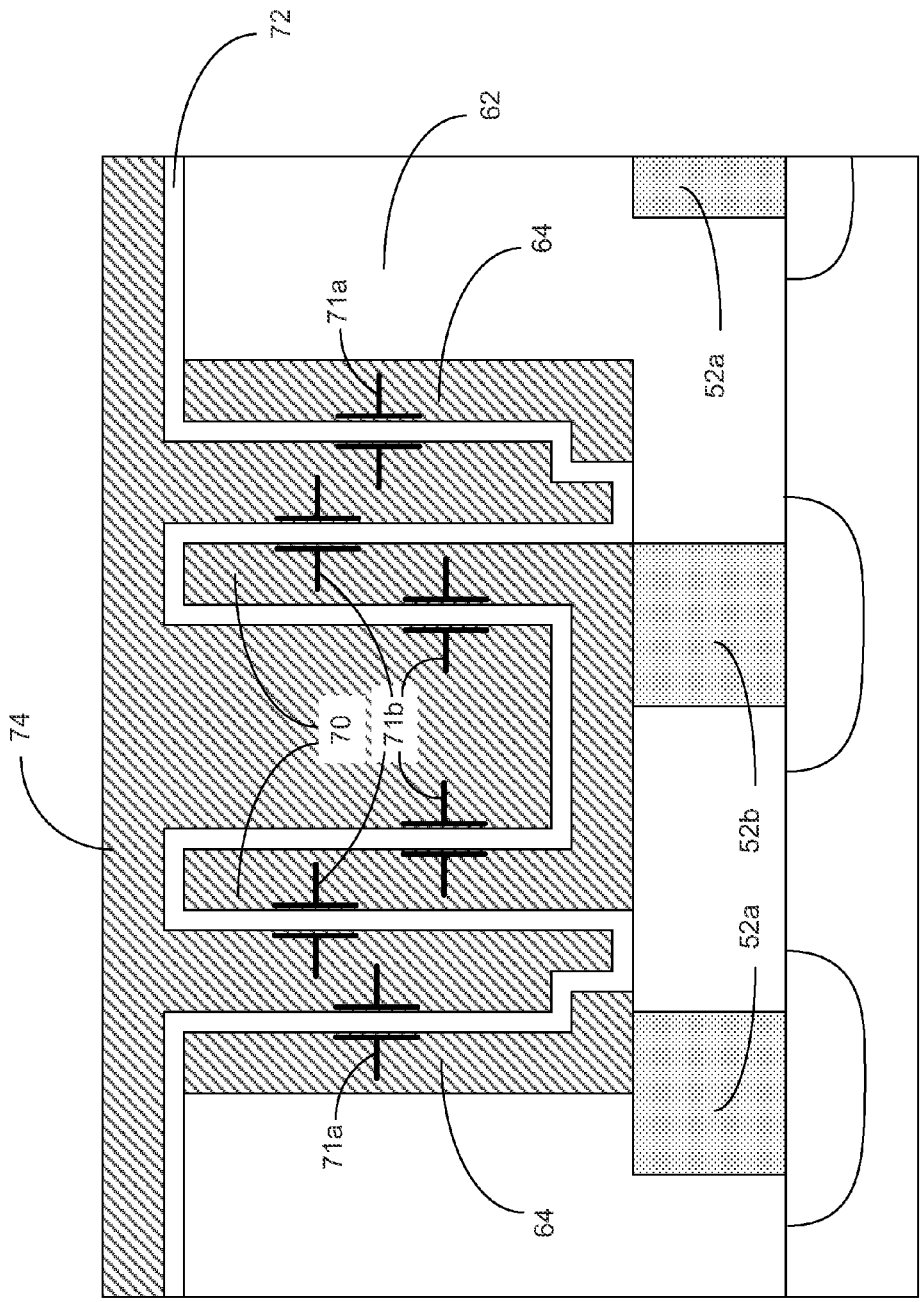

HF solution is preferable because it will well-clean and prepare the exposed surfaces of the poly 1 64 and poly 2 70 for capacitor dielectric 72 formation, as shown in FIG. 9, although other surface preparation techniques (e.g., ashing) could also be used. As one skilled in the art will realize, capacitor dielectric 72 can comprise any number of materials well known in the art as discussed earlier. Thereafter, a cell plate polysilicon layer ("poly 3") 74 is deposited to form the top plates for both of the outer and inner capacitors, as shown in FIG. 10. Because polysilicon has good step coverage properties, poly 3 74 can normally completely fill any remaining gaps as shown, although ultimately the layer may need to be planarized. If any remaining gaps are not filled, an additional conformal layer (e.g., a dielectric layer; not shown) can be deposited for this purpose and to provide a solid surface for further processing. From this point, the integrated circuit is further processed to completion as one skilled in the art will understand.

As shown, the bottom layer of the outer capacitor (poly 1 64) is primarily proximate to the poly 3 74 along its inner vertical edges, and hence primary establishes a capacitance 71a thereto along this edge. By contrast, the bottom layer of the inner capacitor (poly 2 70) is primarily proximate to the poly 3 74 along its inner and outer vertical edges, and hence primarily establishes a capacitance 71b with respect thereto along these edges. (Additionally, horizontal portions of the poly 1 and poly 2 are also proximate to the poly 3 and hence add to the capacitance, but such additional capacitances are not shown for clarity). Thus, the inner capacitor is in a sense two-sided, whereas the outer capacitor is in a sense one-sided.

In an actual application, it is preferable that the poly 1-to-poly 3 capacitance 71a for outer capacitor and the poly 2-to-poly 3 capacitance 71b for the inner capacitor be equal, so that cells communicating with each of these capacitors will behave similarly from an electrical standpoint. In this regard, the effective surface areas of each of the inner and outer capacitors should be roughly equated, with attention paid to additional capacitive effects due to coupling along non-vertical surfaces. Equating the capacitance between the inner and outer capacitors is not difficult: while the inner capacitor takes up a smaller footprint than does the outer capacitor, it is also two-sided which increases its effective area and capacitance. In any event, should capacitances need adjustment to bring them into parity, the thickness of the TiN 66 and dielectric 68 sidewalls can be tailored to change the effective area of the inner capacitor relative to the outer capacitor.

The disclosed nested container capacitor structure provides many benefits over non-nested container capacitors traditionally used as the capacitors in a DRAM cell. For the most part, the nested structure is self aligned and requires minimal photolithography steps. The only significant alignment step is the pattern and etch step used to form the hole 60 (FIG. 3) that defines the capacitor area. As noted earlier, this hole 60 need not be aligned with perfect precision, and in any event is larger and easier to pattern and etch than individual holes used to form single non-nested capacitors. Additionally, the foot print of hole 60, and hence the nested capacitors, is smaller than that of two individualized container capacitors of the prior art. As a result, the cell can be made smaller, and/or the capacitors made larger to increase their capacitances. Moreover, standard processes are used with are cheap, easy, and reliable to implement.

Figure 11:
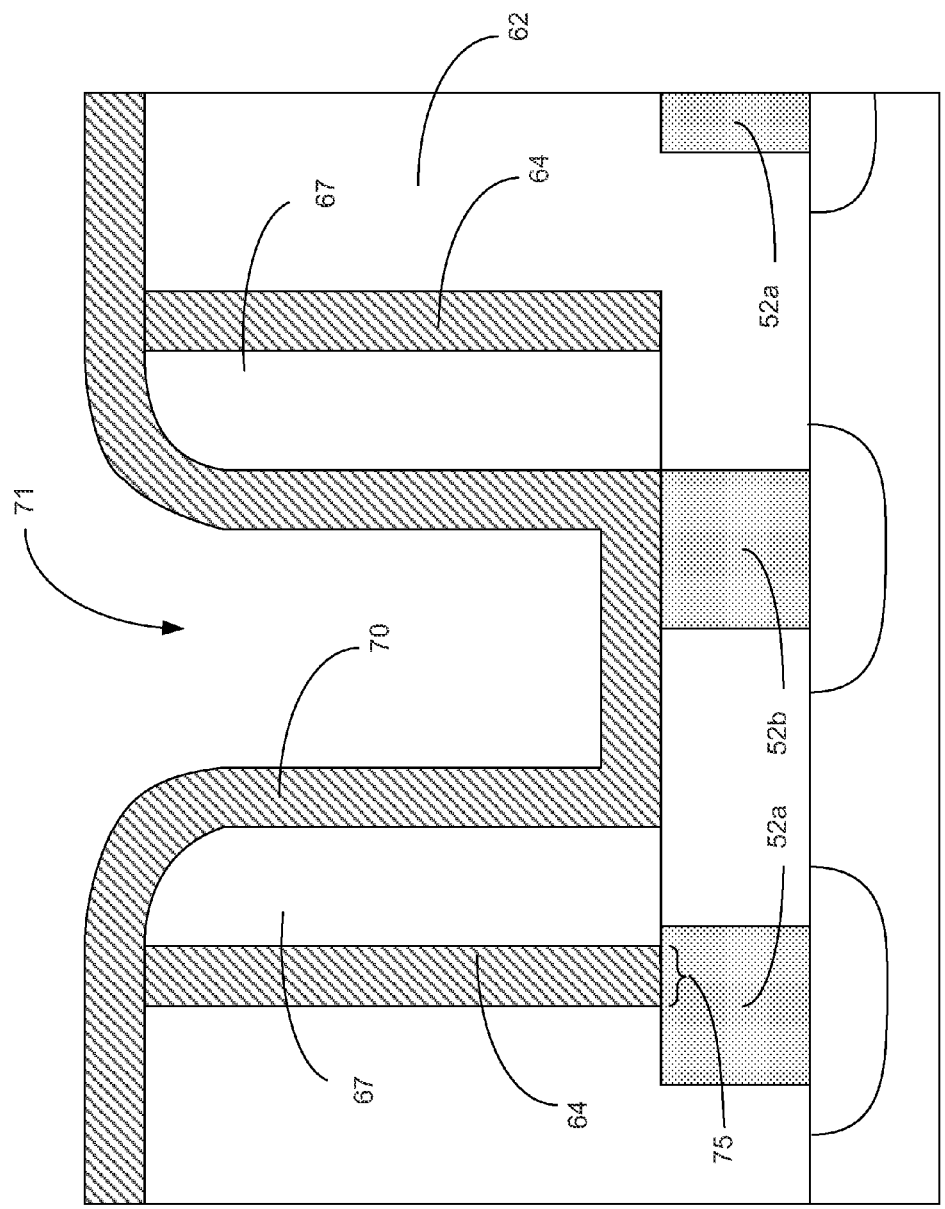
FIG. 11 illustrates a modification to the disclosed process in which only one sacrificial sidewall is used.

Modifications to the basic process disclosed above are possible. For example, FIG. 11 shows the capacitor structure at a processing step roughly equivalent to that shown in FIG. 6. In this embodiment, instead of using two sidewalls 66 and 68, only one sidewall 67 is used, which could be preferably constitute either TiN or undensified oxide. In this embodiment, the poly 1 is deposited and etched back to form sidewalls along the vertical surfaces of the hole 60. Thereafter the sidewall 67 is formed by deposition and etch back. The connection 75 of the poly 1 64 to its plug 52a is thus defined only by the thickness of the poly 1 64, and hence in this embodiment, a thicker layer of poly 1 64 might be beneficial to ensure good electrical contact. By the same token, this modification makes it less likely that the poly 1 64 will short to plug 52b, and hence can add extra margin to the process. In any event, using this modification, only one sacrificial sidewall 67 need be deposited and later removed instead of two (66 and 68) disclosed earlier, saving processing steps. The process would thereafter continue as shown in FIGS. 7 to 10.

Figure 12A:
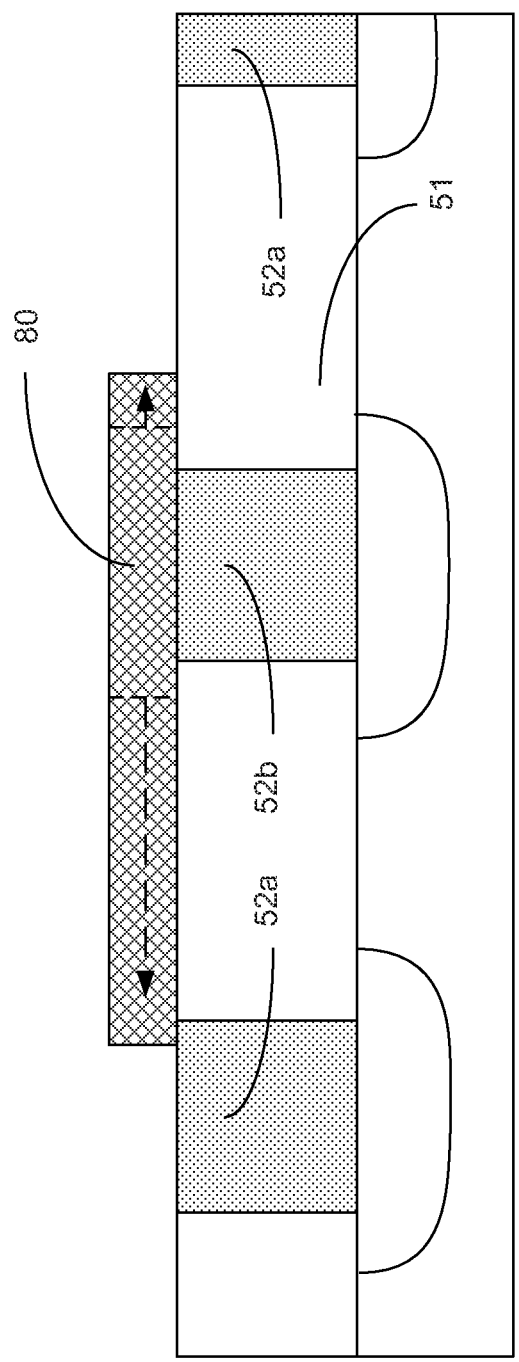
FIGS. 12A and 12B illustrate a modification to the disclosed process in which a protective layer is used to protect one of the plugs.
Figure 12B:
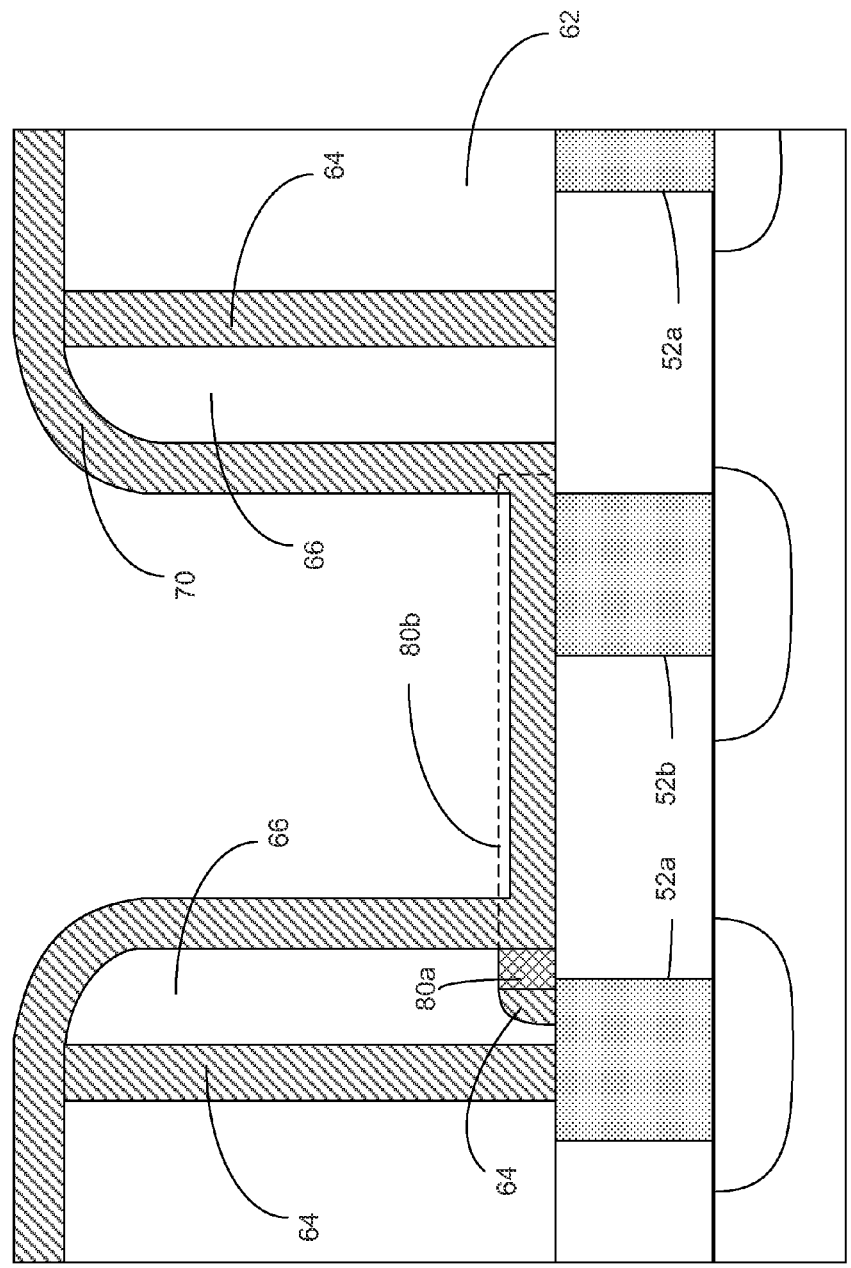

FIGS. 12A and 12B show a modification in which a protective layer 80 is used to help prevent shorting of the poly 1 layer to plug 52b. In this modification, after the polysilicon plugs 52a, 52b have been formed and etched back (e.g., using CMP), a protective layer 80 is patterned and etched over plugs 52b. In this modification, it is beneficial that the protective layer 80 completely cover the surface of plug 52b, but its exact dimensions and alignment are not critical as illustrated by the arrows in FIG. 12A. In a preferred embodiment, the material for the protective layer 80 is silicon nitride ("nitride"). After protective layer 80 definition, dielectric 62 is deposited and etched to form hole 60 as in earlier embodiments (see FIG. 3). Because etching of the oxide dielectric 62 is selective to nitride, the nitride layer 80 will remain at the bottom of the hole 60.

Thereafter, and referring to FIG. 12B, poly 1 64 and TiN 66 are deposited and etched back to form sidewalls as disclosed earlier, and the nitride protective layer 80 is removed to expose underlying plug 52b. This can be achieved in several ways. First, the poly 1 64, TiN 66, and nitride 80 can be etched simultaneously (similarly to FIG. 5) using an etchant that will etch all three materials. Second, and as specifically shown in FIG. 12B, the poly 1 64 can be etched back to form a sidewall prior to TiN 66 deposition (similarly to FIG. 11), using well-known poly etch chemistries. Then, the TiN is deposited and etched back to form a sidewall and to clear any nitride protective layer 80 from plug 52b. This sub-step can involve simultaneous removal of both the TiN 66 and the nitride 80 using $CF_3$, $CF_4$, etc., as the etchant chemistry. Using any of these schemes, it is possible (depending on the alignment of the nitride 80) that some portion of the nitride 80a may remain underneath the poly 1 64/TiN 66 sidewalls, but this is not problematic so long as this residual does not interfere with contact of the poly 1 or poly 2 contact to the plugs 52a, 52b as shown in FIG. 12B. Additionally, some residual poly 1 64 or TiN 66 might remain on the edges of the nitride 80 as shown, but this can be addressed by overetching to ensure removal of these residuals. In any event, such conductive residuals are not problematic so long as they don't encourage shorting of the poly 1 to the poly 2 as also shown in FIG. 12B.

Using any of these etching schemes, the nitride 80 will be removed (as shown in dotted lines 80b), thus exposing at least some portion of plug 52b. Because the nitride layer 80 completely covers plug 52b, there is no chance that the poly 1 64 can short to it, which constitutes the primary advantage of this embodiment. Thereafter, poly 2 70 can be deposited, and processing can continue as shown in FIGS. 7 to 10.

Figure 13A:
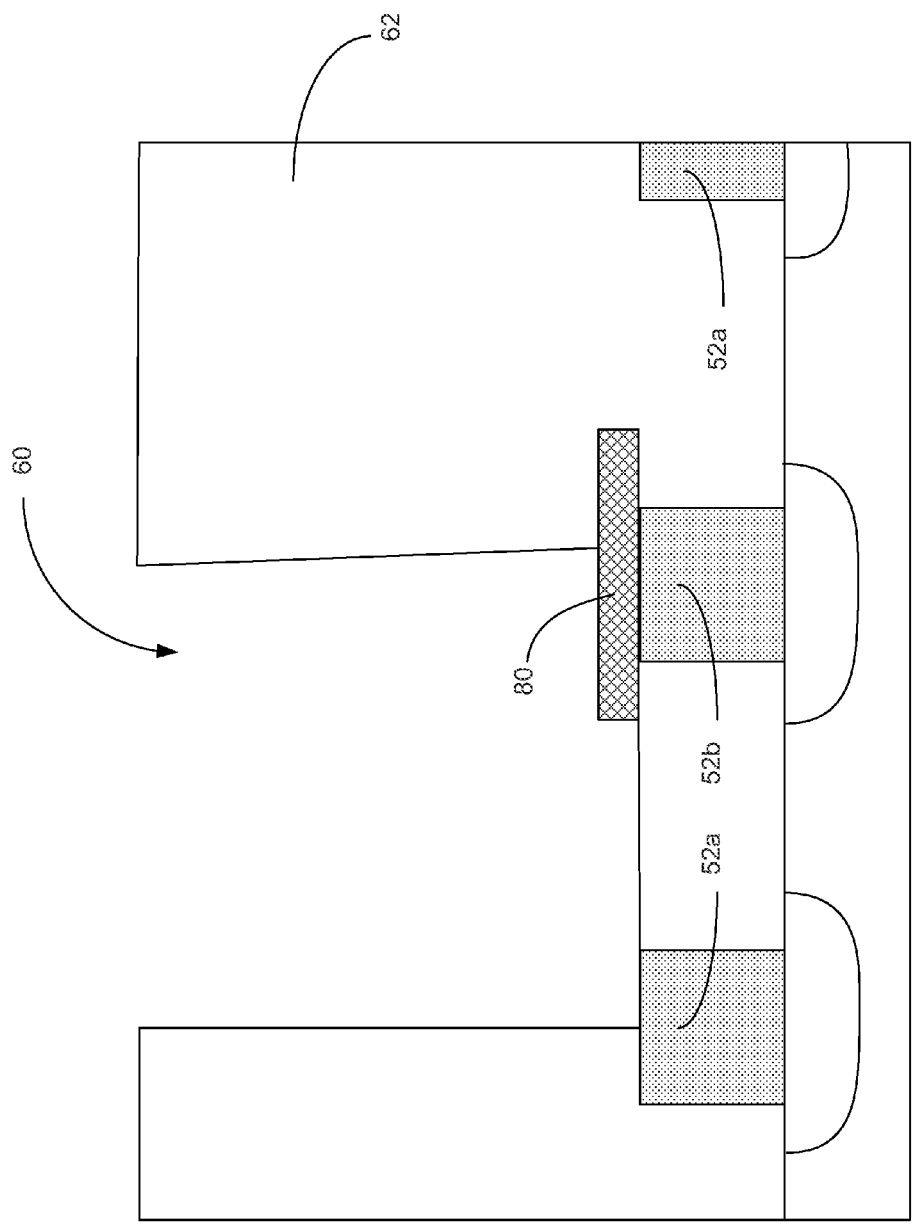
FIGS. 13A and 13B illustrate a modification to the disclosed process in which a protective layer is used to protect one of the plugs, and in which the protected plug is not entirely within the container capacitor area.
Figure 13B:
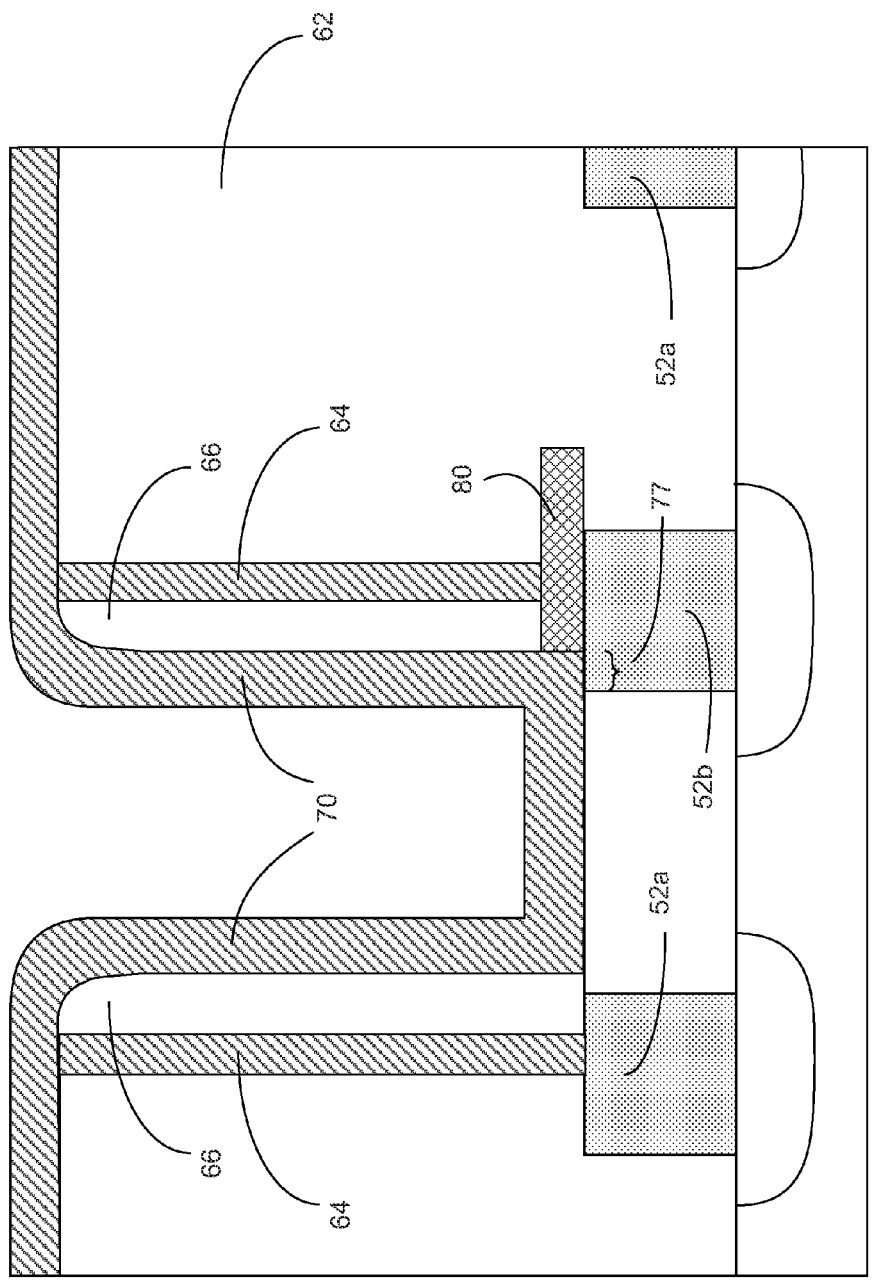

Although the hole 60 (see FIG. 3) is preferably formed so as to substantially encompass each of the plugs 52a, 52b, this is not strictly necessary in all embodiments, as shown with reference to FIG. 13A. In FIG. 13B, the hole 60 is narrower such that plug 52b is not wholly incorporated therein. However, plug 52b is again protected by a protective layer 80 of nitride, which was patterned and etched prior to deposition of dielectric 62 as discussed in the last embodiment. This protective layer 80 again keeps the poly 1 from contacting plug 52b. In this embodiment, it is preferable when depositing the TiN 66 that the thickness of the poly 1 64 and TiN are such that they will not completely overshadow plug 52b when they are etched back along with nitride 80, as shown in FIG. 13B. By so doing, some portion 77 of plug 52b is exposed after the TiN 66 is etched back, and this portion 77 can contact the poly 2 as shown in FIG. 13B. Processing from this point can continue as shown in FIGS. 7 to 10.

Figure 14A:
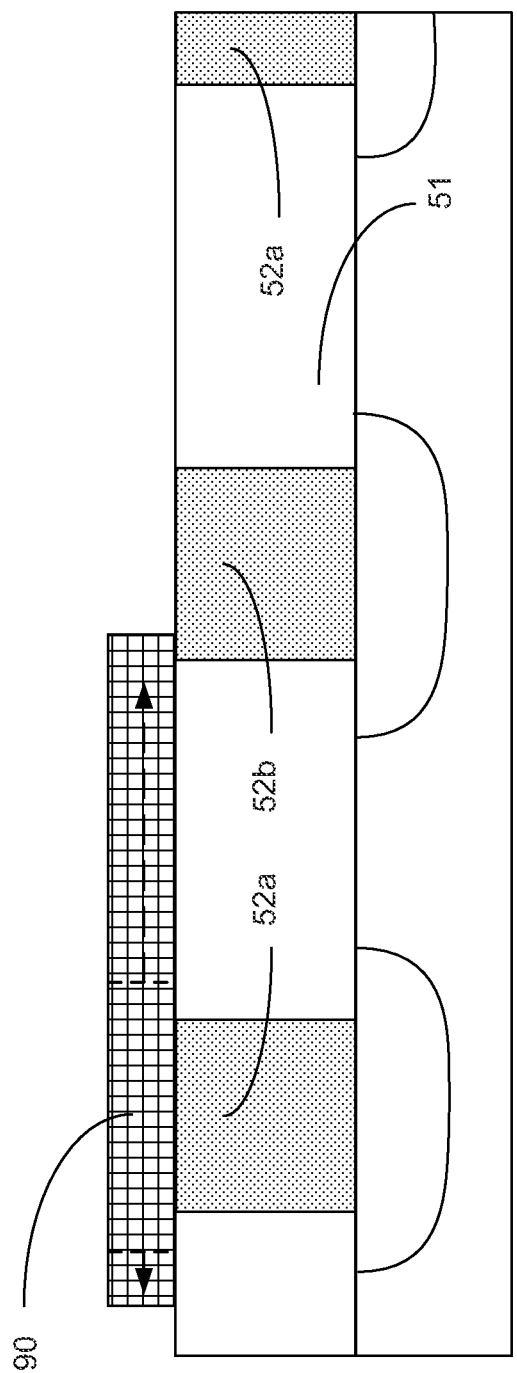
FIGS. 14A-14D illustrate a modification to the disclosed process in which a conductive layer is used to couple one of the nested capacitors to its plug, thus allowing the plug to be at least partially located outside of the container capacitor area.
Figure 14B:
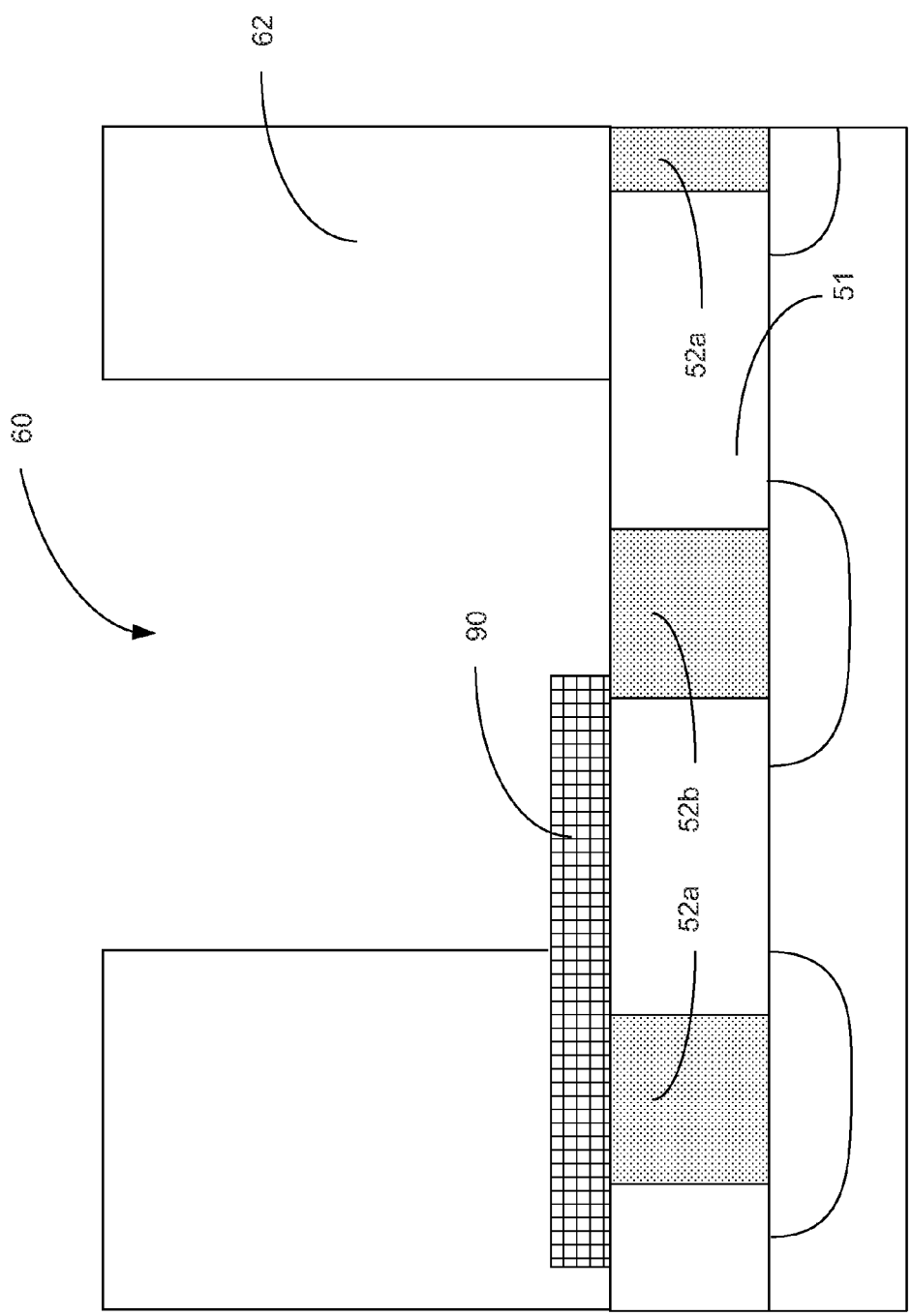
Figure 14C:
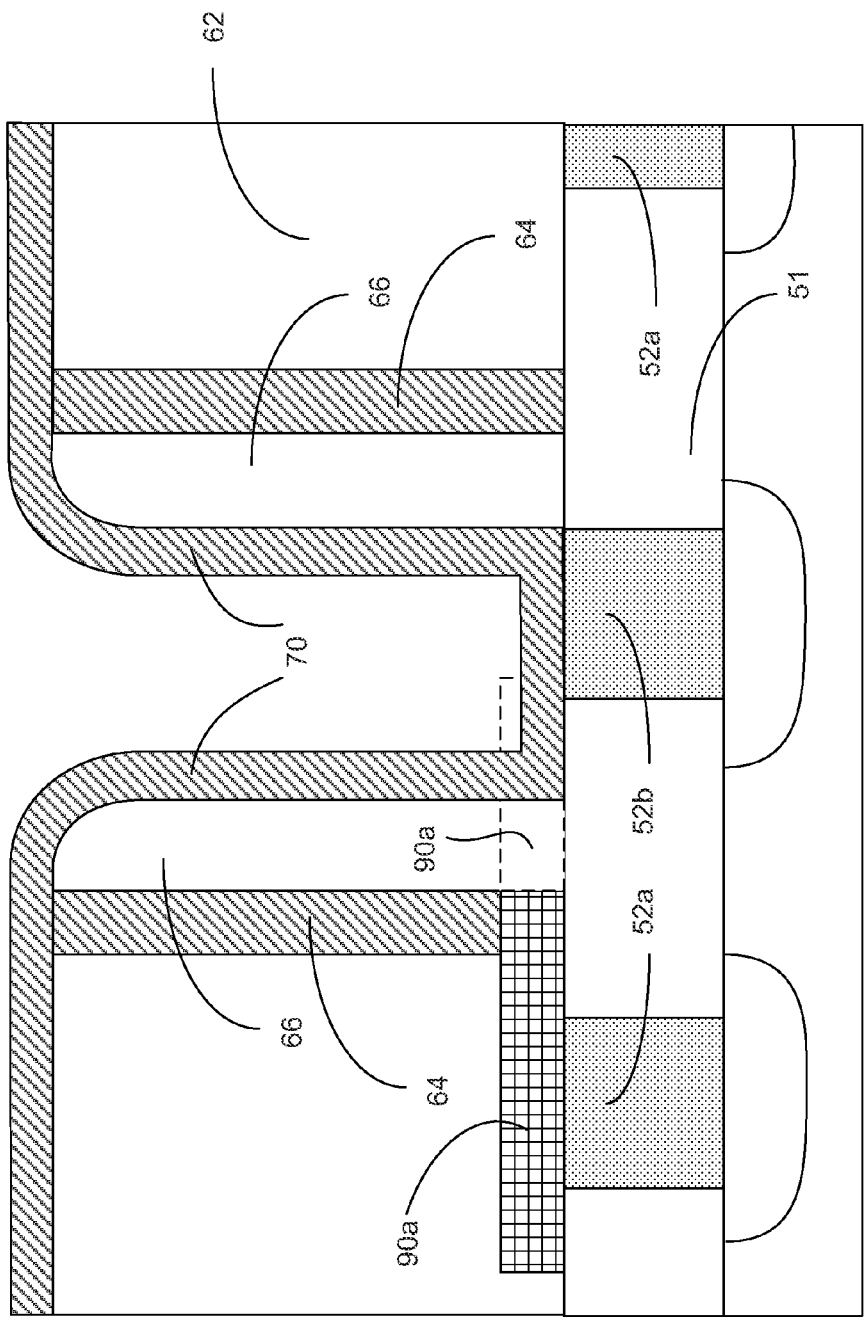
Figure 14D:
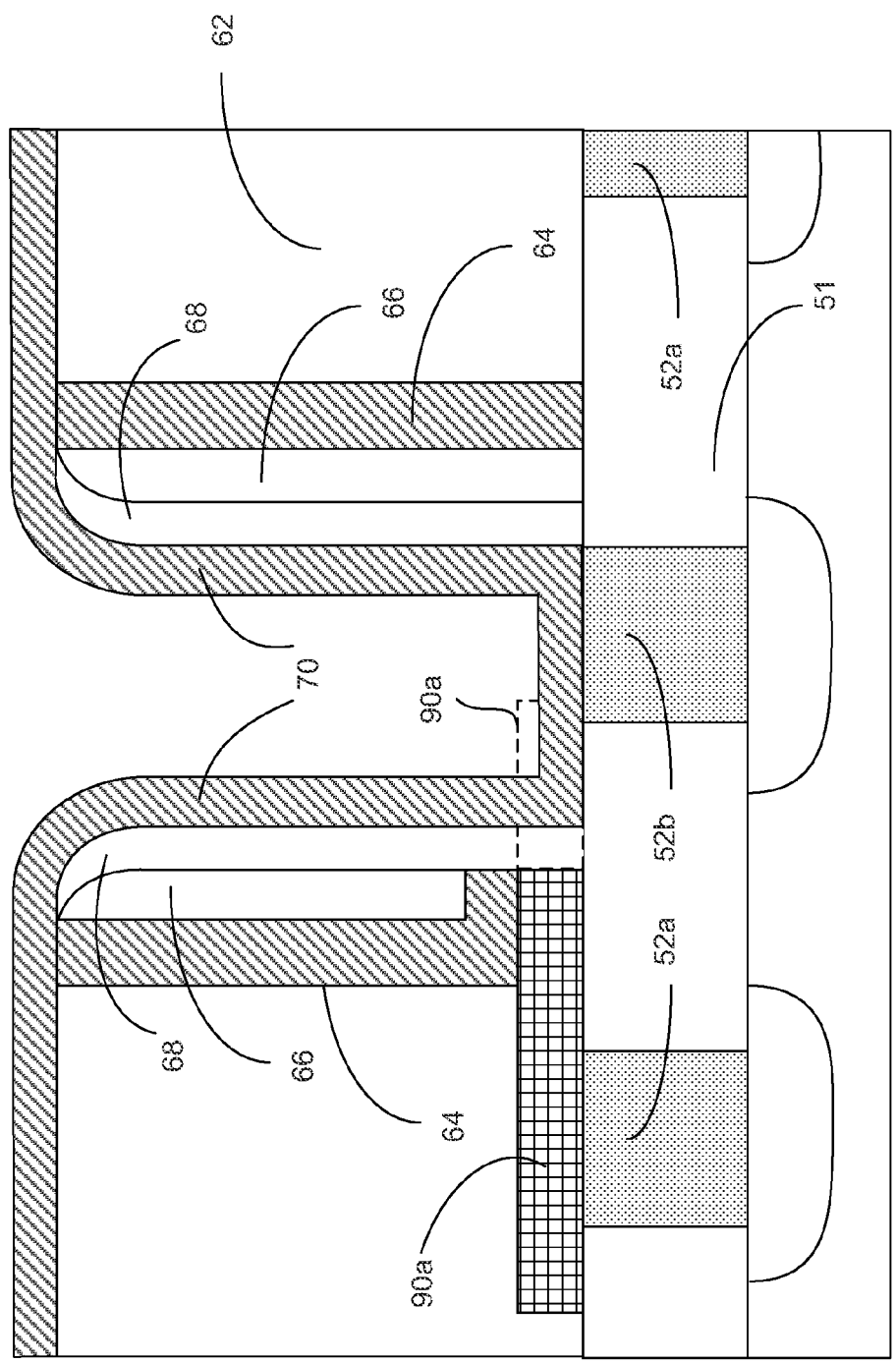

In another modification, the disclosed nested capacitor container technique can be used even if one of the plugs 52a or 52b are wholly or partially outside of the hole 60, as is shown in FIG. 14B, in which plug 52a resides completely outside of the hole 60. Referring to FIG. 14A, a conductive layer 90 has been deposited and etched after plug 52a, 52b formation, but before formation of dielectric 62. The conductive layer 90 is preferably polysilicon. The alignment of conductive layer 90 is not terribly critical, as shown by the arrows of FIG. 14A. After patterning of the conductive layer 90, the dielectric 62 is formed and the hole 60 is etched. Because the etching of the dielectric 62 is selective to the conductive layer 90, the conductive layer 90 remains in the bottom of the hole 60 as shown in FIG. 14B. Thereafter poly 1 64 is deposited. The poly 1 64 may be etched back by itself as in FIG. 11 (FIG. 14C), or may be etched back along with the TiN 66 as used with an oxide sidewall 68 as in FIG. 5 (FIG. 14D).

Because the etch chemistries introduced earlier will etch both poly and TiN simultaneously, either of these etch back processes will also clear the conductive layer 90 where it is exposed during etch back, i.e., in regions 90a. It is possible that some amount of poly 1 64 and/or TiN 66 may remain along the edges of the conductive layer 90 during etch back, but this is not problematic as the residuals can be overetched to remove them, or because such residuals would not cause a risk of shorting the poly 1 to the poly 2. In any event, if the poly 1 and TiN 66 are etched back simultaneously (FIG. 14D), use of a dielectric sidewall 68 such as that used in FIG. 5 is preferable to prevent shorting of the poly 1 64 or conductive layer 90 to the subsequently-deposited poly 2 70. Through use of the conductive layer 90, it is seen in FIGS. 14C and 14D that the plug 52a outside of the hole 60 can be coupled to the poly 1 64 and hence the outer container capacitor, without fear of shorting to the inner capacitor. Processing from the points shown in FIGS. 14C and 14D can continue as shown in FIGS. 7 to 10.

Figure 15A:
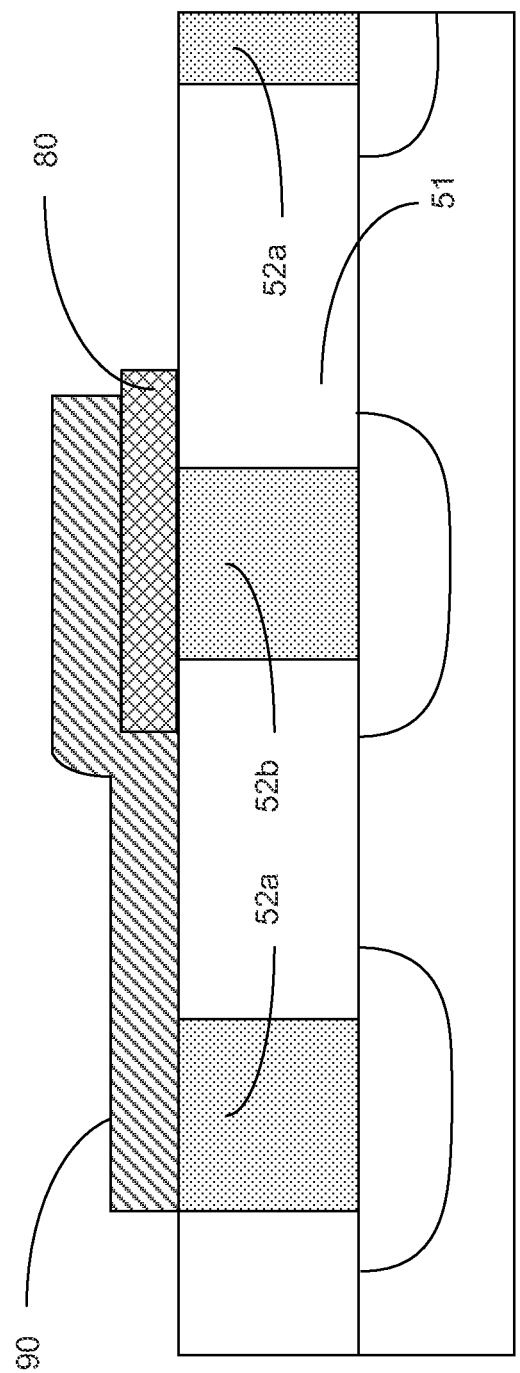
FIGS. 15A-15C illustrate a modification to the disclosed process in which a conductive layer and a protective layer are used in conjunction.
Figure 15B:
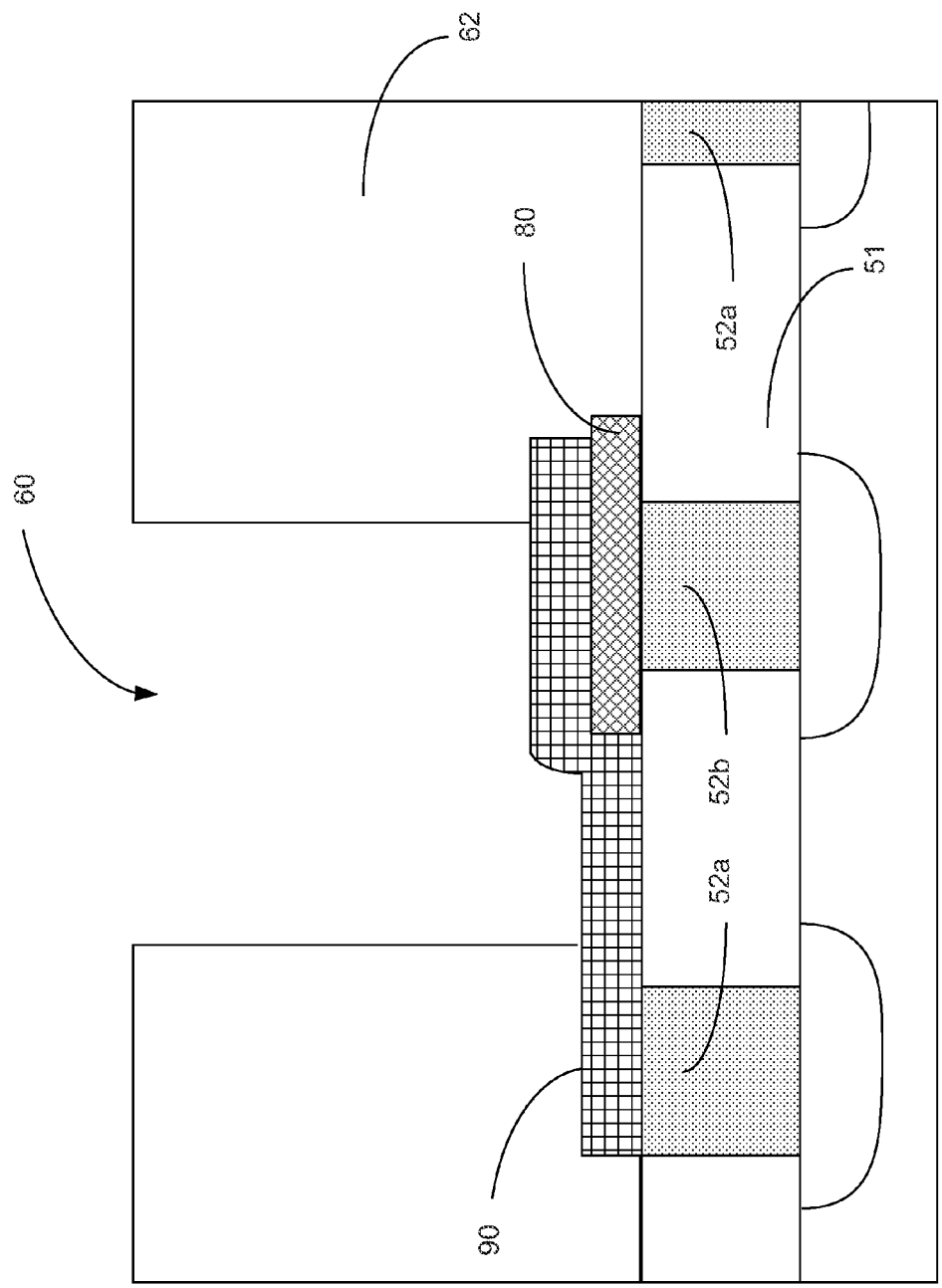
Figure 15C:
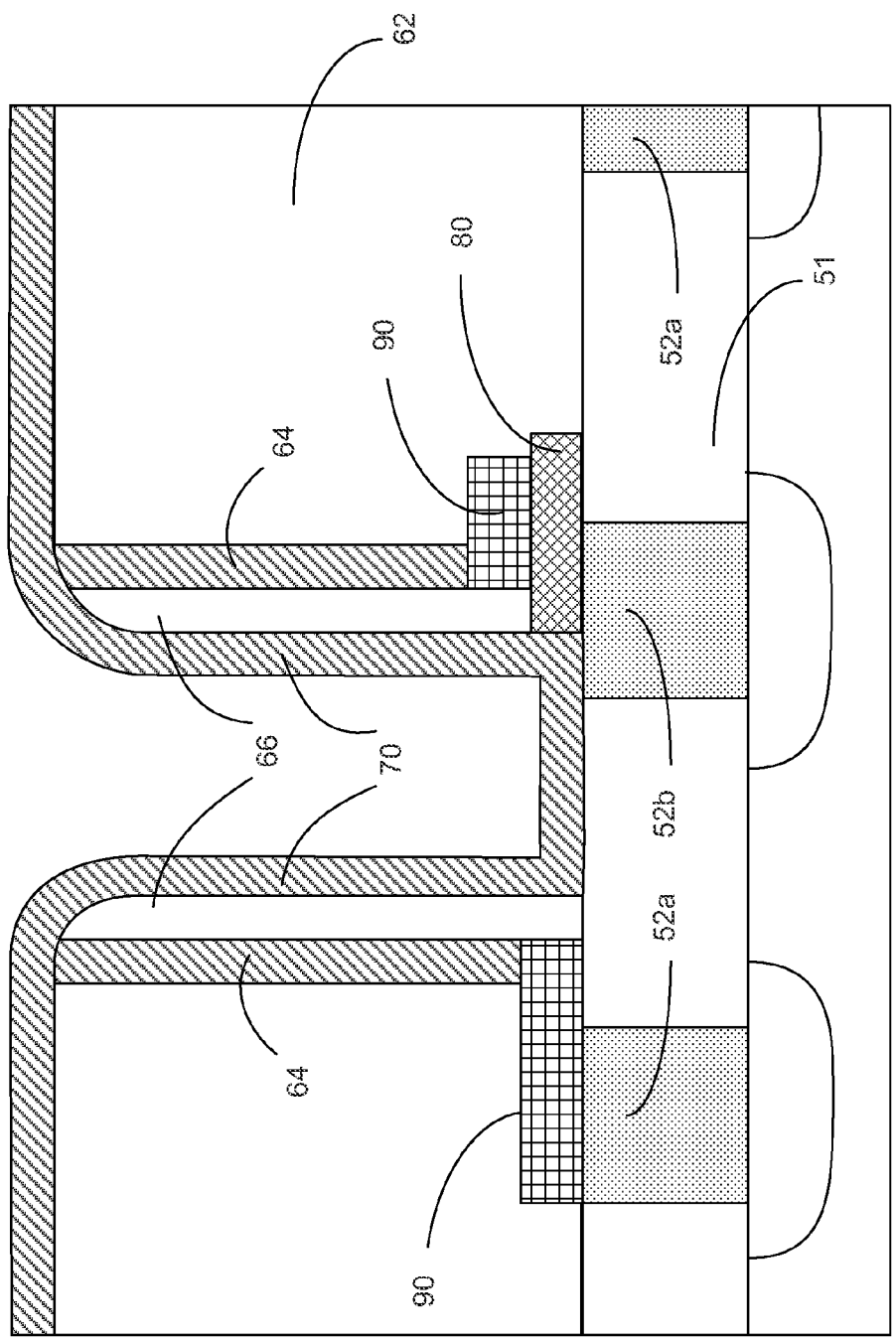

In another modification, both a protective layer 80 and a conductive layer 90 can be used in conjunction, as shown initially in FIG. 15A. In this embodiment, the protective layer 80 (e.g., nitride) is preferably patterned and etched prior to patterning and etching of the conductive layer 90 (e.g., poly). Then the dielectric 62 is formed and etched to form hole 60 as shown in FIG. 15B. The conductive layer 90 need not overlie the protective layer 80, but such overlap is permissible and can be beneficial for reasons to be explained shortly. Thereafter the poly 1 64 is deposited and both the poly 1 64 and conductive layer 90 are etched as in earlier embodiments and as shown in FIG. 15C. Because the conductive layer 90 extends beyond both sides of hole 60, the poly 1 64 contacts the conductive layer 60 on both sides. (Assuming the conductive layer 90 is not a mere strap but a pad that extends beyond all four edges of the hole 60, the plug 52a-to-poly 1 contact region would define a ring, or some portion of a ring). Thereafter, TiN 66 is deposited and etched back along with the protective layer 80 as in earlier embodiments. This exposes a portion of plug 52b, which contacts the poly 2 when deposited as in earlier embodiments. Processing from this point can continue as shown in FIGS. 7 to 10.

Figure 16A:
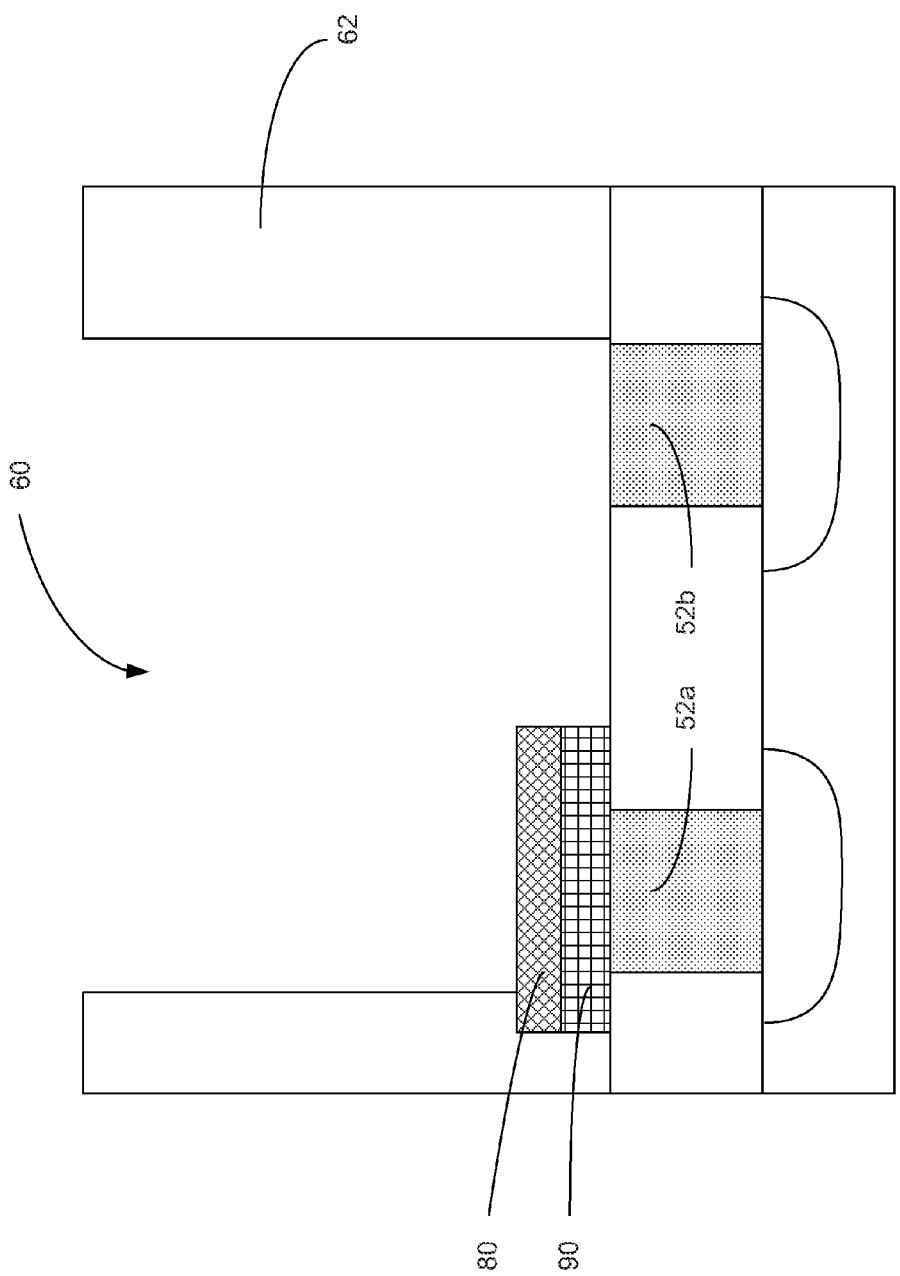
FIG. 16A-16C illustrate a modification to the disclosed process in which a conductive layer and a protective layer are used in conjunction and are patterned together.

In the foregoing embodiments employing the use of protective layers 80 or conductive layers 90, it should be understood that definition of each of these layers requires an additional patterning and etching step, but such additional processing may in some embodiments be sensible to undertake for the benefits they provide, such as added flexibility in designing the cell, provision of extra processing alignment margin, etc. However, in an embodiment in which both a protective layer 80 and conductive layer 90 are used, only one patterning step need be used, as shown in FIG. 16A. As shown, the conductive layer 90 is deposited followed by the protective layer 80, and then both are patterned as a stack. Although this requires one lithography step, different plasma etchants may be used to remove the protective layer 80 (e.g., a nitride etchant) and the conductive layer 90 (e.g., a polysilicon etchant). Then dielectric 62 can be deposited, and hole 60 etched, in which the protective layer 80 will protect the remaining portions of the protective layer and conductive layer as shown.

Figure 16B:
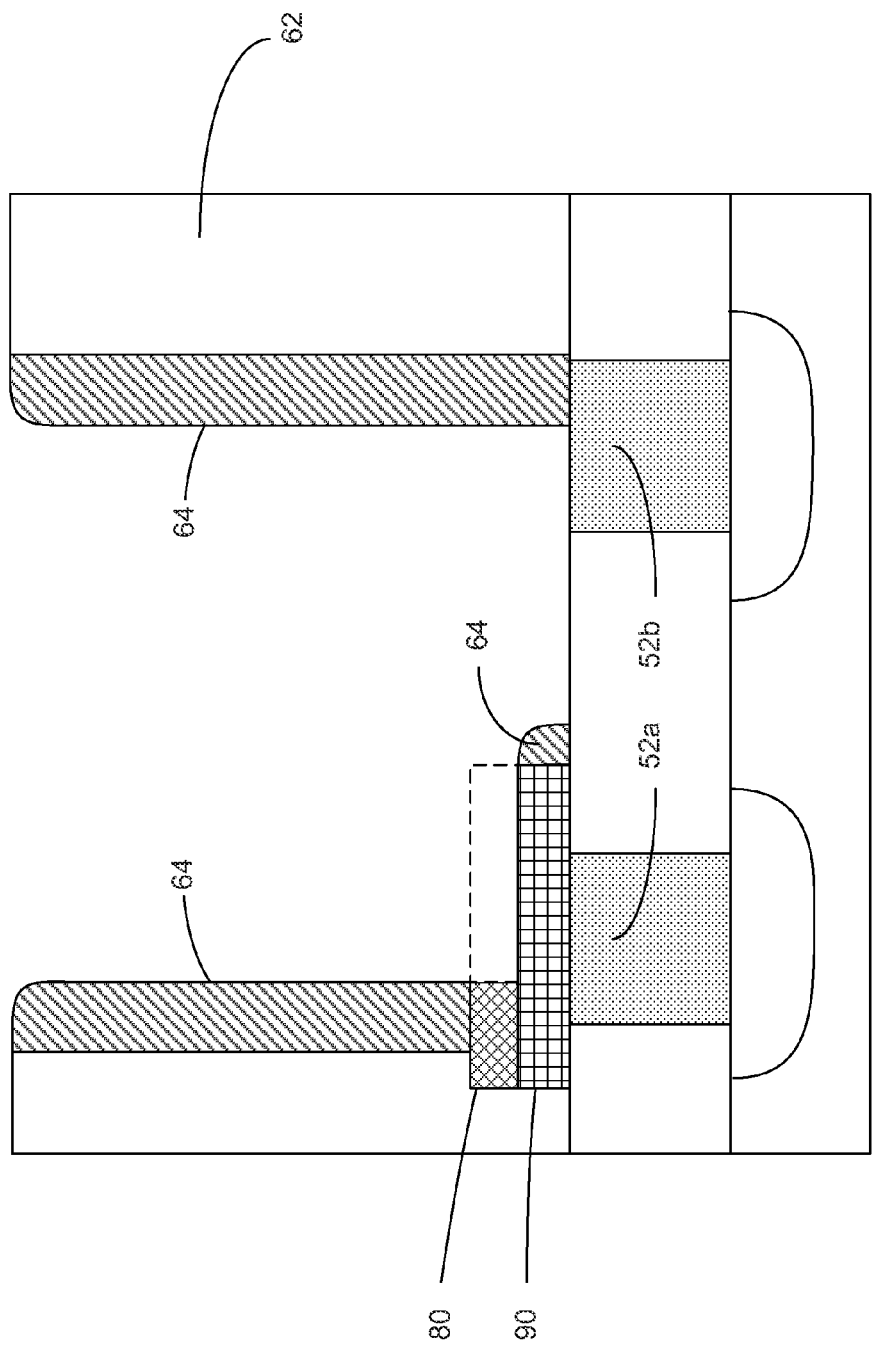

Next, poly 1 64 is deposited and etched back to form sidewalls, as shown in FIG. 16B. This may leave residual poly 1 64 on the edges of the protective layer 80/conductive layer 90, but this is not problematic as it will not promote poly 1 to poly 2 shorting; in any event, such residuals can be overetched to remove them as noted earlier. After poly 1 64 etch back, the nitride protective layer 80 is removed as shown in dotted lines. The etchant used is preferably selective to poly, but this is not strictly necessary. In any event, some amount of the conductive layer 90 will remain as shown. As noted, the poly 1 64 is in contact with plug 52b, but plug 52a has been protected from and does not make contact with the poly 1.

Figure 16C:
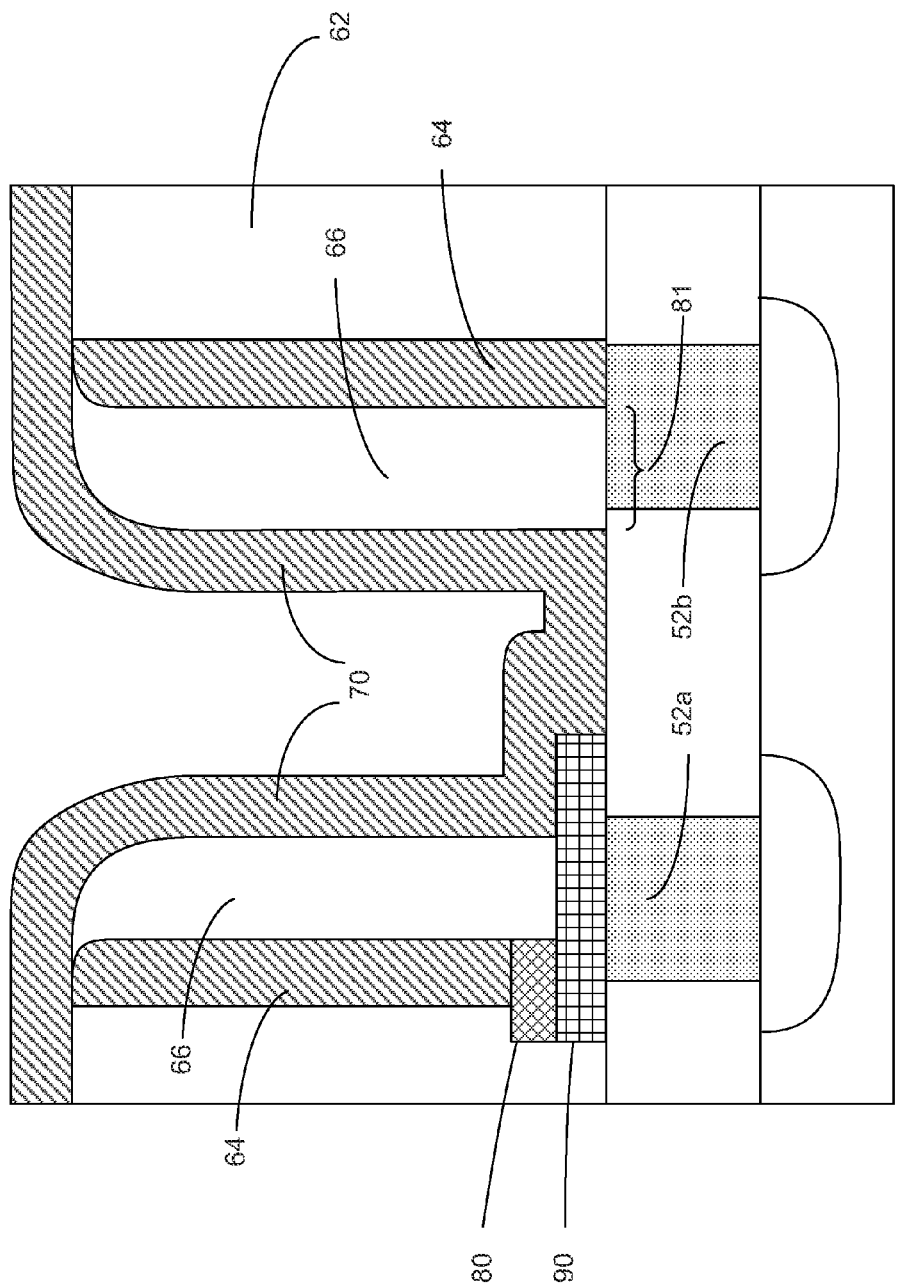

Thereafter, and referring to FIG. 16C, TiN sidewalls 66 are formed as in earlier embodiments, followed by poly 2 70 deposition. The thickness 81 of the TiN sidewall 66 should be such that the subsequently-deposited poly 2 will not short to plug 52b as shown, and in this regard, use of a sidewall oxide 68, such as disclosed in FIG. 6, can be beneficial although not shown. As seen, the poly 2 contacts the now-exposed portions of the conductive layer 90, thereby establishing a conductive path between plug 52a and the poly 2 70. Processing from this point can continue as shown in FIGS. 7 to 10.

Figure 17:
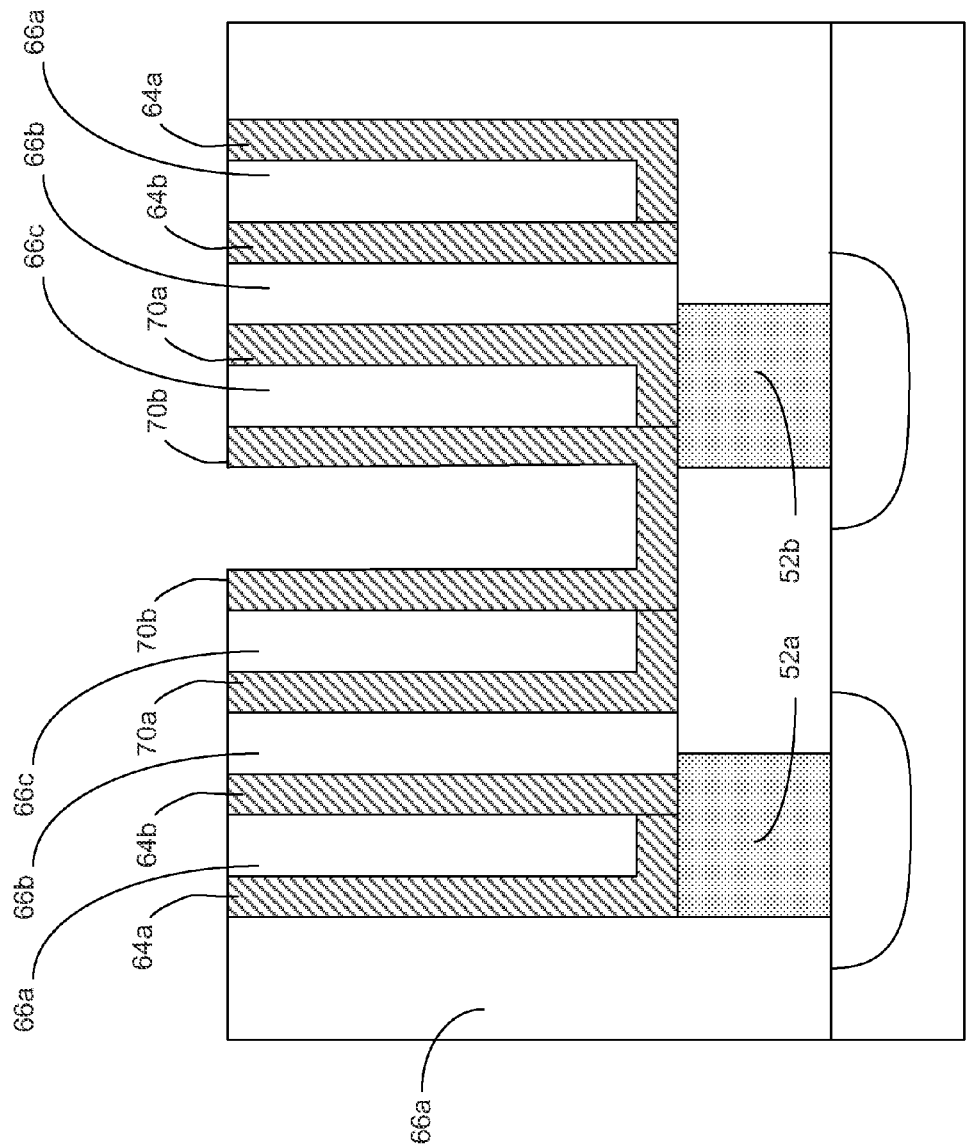
FIG. 17 illustrates a modification in which at least one of the nested capacitor plates is itself formed using a nested structure.

In another modification, either of the inner or outer container capacitors, or both, can themselves be formed with a nested structure. This is shown in FIG. 17, which shows a state in the processing akin to that shown in FIG. 7 (i.e., after deposition of the bottom plates of the capacitors and after CMP etching, but before liquid-etch removal of the sidewalls). As shown, a first poly 1 layer 64a has been deposited, followed by deposition of a first TiN layer 66a, which are then etched back together. Then a second payer of poly 1 64b is deposited and etched back, followed by deposition and etch back of a second TiN layer 66b. Thereafter, a first poly 2 layer 70a is deposited, followed by deposition of a third TiN layer 66c, which are then etched back together. Finally, a second layer of poly 2 70b is deposited. The result is a structure in which the bottom plates for each of the inner and outer capacitor have nested containers. This structure is beneficial in that it increases the effective areas for each of the capacitors (i.e., the areas which eventually be proximate to the poly 3 (not shown)), and hence their capacitances. Processing from this point will include process steps discussed earlier, such as liquid etching of the TiN sidewalls 66a-66c, capacitor dielectric 72 formation, poly 3 74 deposition, etc., as shown in FIGS. 8 to 10. Of course, other processing steps mentioned earlier (e.g., the use of dielectric (oxide) sidewall 68, use of a protective layer 80, use of a conductive layer 90, etc.) can be used to further improve upon or modify the structure shown in FIG. 17.

Figure 18:
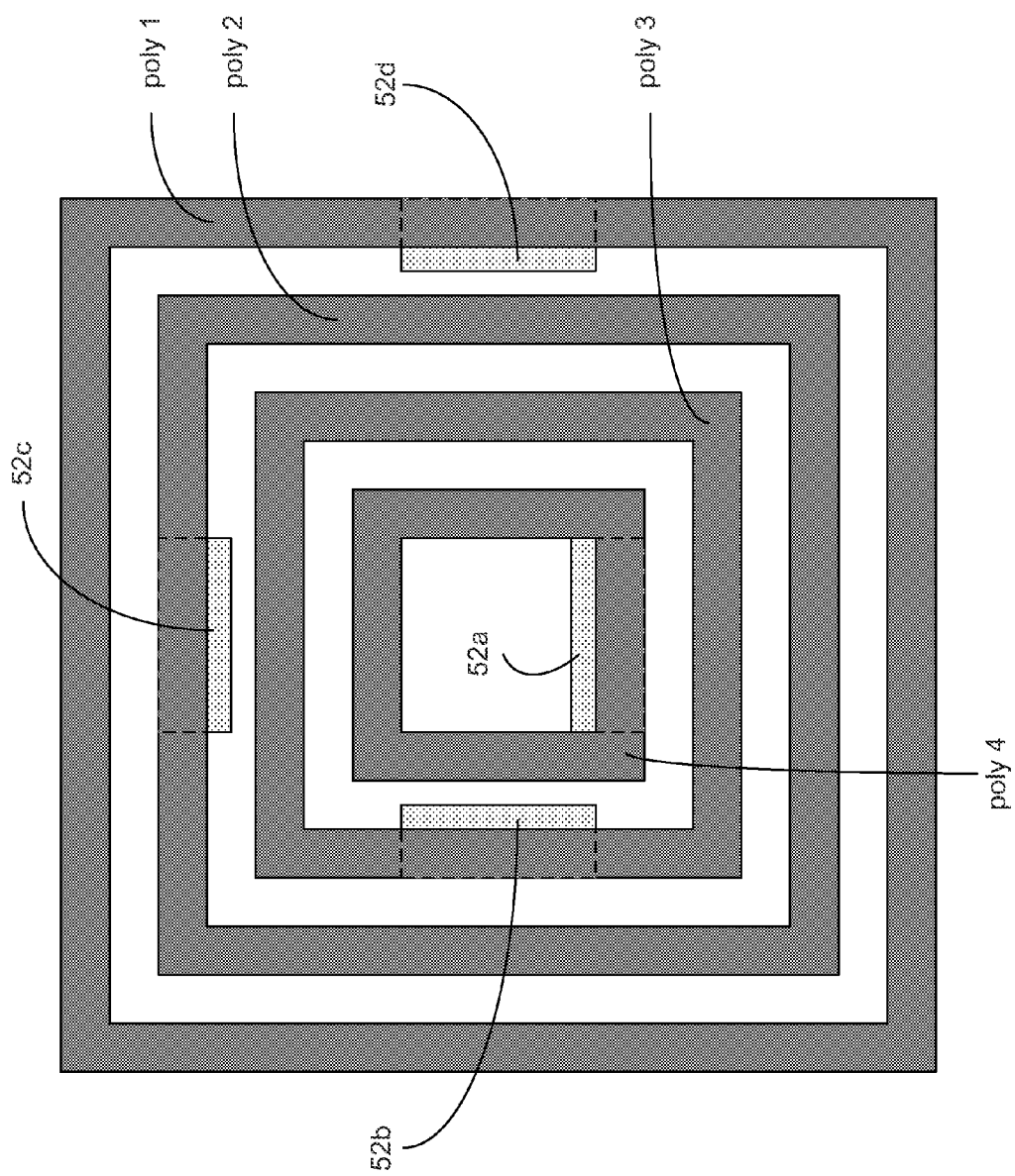
FIG. 18 illustrates a modification in which more than two nested container capacitors are used.

In another modification, the disclosed techniques can be used to form more than two nested capacitors. Referring to FIG. 18, there is shown a top-down view of four nested capacitors. From this view, it can be seen that four poly layers (poly 1 through poly 4) have been nested and that each is in contact with a plug 52a-52d. Although not explicitly shown, from the foregoing processing descriptions it should be apparent that sidewalls (e.g., TiN or oxide) intervene between each of the poly layers, and that a final plate poly layer would be deposited over all of the poly layers. Similarly, different numbers of nested capacitors (e.g., 3, 6, 8, etc.) could be fabricated.

Although the disclosed embodiments have to this point all contemplated a common plate layer (e.g., poly 3 74 in FIG. 10), it should be understood that this plate layer could itself be patterned and etched to allow different voltages to appear on the plates for the various nested capacitors.

While the disclosed nested container capacitor solutions were developed primarily with the manufacture of DRAM cells in mind, one skilled in the art will appreciate that capacitors have many uses in electronics, and hence that the disclosed solutions can have applicability to other types of integrated circuits.

Although the disclosed capacitor structure is shown as being particularly useful for coupling the capacitors to plugs 52a, 52b, the nested capacitors can be connected to other types of nodes or contacts as well, such as diffusion regions, metallic lines, etc.

It should be understood that the inventive concepts disclosed herein are capable of many modifications. To the extent such modifications fall within the scope of the appended claims and their equivalents, they are intended to be covered by this patent.

What is claimed is:

1. A capacitor structure for an integrated circuit, comprising:
    a hole in a dielectric layer on the integrated circuit to define a capacitor area;
    a first bottom capacitor plate within the hole in the integrated circuit and in contact with a first contact;
    a second bottom capacitor plate within the hole and nested within the first bottom capacitor plate and in contact with a second contact electrically isolated from the first contact;
    a capacitor dielectric in contact with the first and second bottom capacitor plates; and
    a top capacitor plate in contact with the capacitor dielectric and over the first and second bottom capacitor plates wherein the first and second contacts are each wholly or partially inside the hole.

2. The capacitor structure of claim 1, wherein one of the first or second contacts is partially outside the hole.

3. The capacitor structure of claim 1, wherein the capacitor dielectric overlies the contacts.

4. The capacitor structure of claim 1, further comprising a conductive layer to couple the first contact to the first bottom capacitor plate.

5. The capacitor structure of claim 1, wherein the second bottom capacitor plate comprises a sidewall and a horizontal portion.

6. The capacitor structure of claim 5, wherein the first bottom capacitor plate comprises a sidewall on edges of the hole.

7. The capacitor structure of claim 6, wherein the first bottom capacitor plate further comprises a horizontal portion on the bottom of the hole.

8. The capacitor structure of claim 1, wherein the first contact is coupled to a source or drain region of a first access transistor, and wherein the second contact is coupled to a source or drain region of a second access transistor.

9. A capacitor structure for an integrated circuit, comprising:
    a hole in a dielectric layer on the integrated circuit to define a capacitor area;
    a first capacitor within the hole comprised of a first plate and a common plate, wherein a bottom of the first plate is coupled to a source or drain region of a first access transistor;
    a second capacitor within the hole and nested within the first capacitor comprised of a second plate and the common plate, wherein a bottom of the second plate is coupled to a source or drain region of a second access transistor; and
    a capacitor dielectric between the first plate and the common plate, and between the second plate and the common plate.

10. The capacitor structure of claim 9, wherein the common plate is coupled to a reference voltage.

11. The capacitor structure of claim 9, wherein the first and second capacitors are concentric.

12. The capacitor structure of claim 9, wherein the bottom of the first plate is coupled to the source or drain region of the first access transistor by a first contact, and wherein the bottom of the second plate is coupled to the source or drain region of the second access transistor by a second contact.

13. The capacitor structure of claim 9, wherein the first and second plates comprise substantially vertical portions.

14. The capacitor structure of claim 13, wherein the substantially vertical portions of the second plate are nested within the substantially vertical portions of first plate.

15. The capacitor structure of claim 9, wherein the common plate comprises substantially vertical portions.

16. A capacitor structure for an integrated circuit, comprising:
- a hole in a dielectric layer on the integrated circuit to define a capacitor area;
- a first bottom capacitor plate within the hole in the integrated circuit and in contact with a first contact;
- a second bottom capacitor plate within the hole and nested within the first bottom capacitor plate and in contact with a second contact electrically isolated from the first contact;
- a capacitor dielectric layer in contact with the first and second bottom capacitor plates; and
- a top capacitor plate in contact with the capacitor dielectric layer and over the first and second bottom capacitor plates wherein
  - the first contact is coupled to a first doped region of a substrate; and
  - the second contact is coupled to a second doped region of the substrate.

17. The capacitor structure of claim 16, wherein the substrate comprises a silicon substrate.

18. A capacitor structure for an integrated circuit, comprising:
- a hole in a dielectric layer on the integrated circuit to define a capacitor area;
- a first capacitor within the hole comprised of a first plate and a common plate;
- a second capacitor within the hole and nested within the first capacitor comprised of a second plate and the common plate; and
- a capacitor dielectric in contact with the first plate and the second plate and the common plate wherein a bottom of the first plate is coupled to a source or drain region of a first access transistor by a first contact.

19. A capacitor structure for an integrated circuit, comprising:
- a hole in a dielectric layer on the integrated circuit to define a capacitor area;
- a first capacitor within the hole comprised of a first plate and a common plate;
- a second capacitor within the hole and nested within the first capacitor comprised of a second plate and the common plate; and
- a capacitor dielectric in contact with the first plate and the second plate and the common plate wherein a bottom of the second plate is coupled to a source or drain region of a second access transistor by a second contact.

20. The capacitor structure of claim 19, wherein:
the first plate comprises polysilicon;
the second plate comprises polysilicon; and
the common plate comprises polysilicon.

* * * * *